US012811275B2

(12) United States Patent
Liao

(10) Patent No.: US 12,811,275 B2
(45) **Date of Patent: *Nov. 24, 2026**

(54) ANTENNA APPARATUS AND METHOD

(71) Applicant: Taiwan Semiconductor Manufacturing Co., Ltd., Hsinchu (TW)

(72) Inventor: Wen-Shiang Liao, Toufen Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 19/211,998

(22) Filed: May 19, 2025

(65) Prior Publication Data

US 2025/0286267 A1 Sep. 11, 2025

Related U.S. Application Data

(63) Continuation of application No. 17/864,765, filed on Jul. 14, 2022, now Pat. No. 12,334,625.

(51) Int. Cl.
*H01Q 1/22* (2006.01)
*H10W 70/685* (2026.01)
(Continued)

(52) U.S. Cl.
CPC ........ *H01Q 1/2283* (2013.01); *H10W 70/685* (2026.01); *H10W 74/01* (2026.01);
(Continued)

(58) Field of Classification Search
CPC .. H01Q 1/2283; H01Q 9/0407; H01Q 21/205; H10W 70/685; H10W 74/01;
(Continued)

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |

(Continued)

FOREIGN PATENT DOCUMENTS

| | | |
|---|---|---|
| CN | 109585428 A | 4/2019 |
| TW | 201911496 A | 3/2019 |

OTHER PUBLICATIONS

Jeong et al., "High performance air gap transmission lines for millimeter wave applications," 2002 IEEE MTT-S International Microwave Symposium Digest (Cat. No. 02CH37278), Seattle, WA, USA, vol. 2, Jun. 2002, pp. 661-664.

(Continued)

*Primary Examiner* — Dimary S Lopez Cruz
*Assistant Examiner* — Brandon Sean Woods
(74) *Attorney, Agent, or Firm* — Slater Matsil, LLP

(57) ABSTRACT

A package structure includes a first die, an insulating material around the first die, a first antenna extending through the insulating material, wherein the first antenna includes a first conductive plate extending through the insulating material and a plurality of first conductive pillars extending through the insulating material, wherein the first conductive plate is disposed between the plurality of first conductive pillars and the first die, and a first high-k block embedded in the insulating material, wherein the first high-k block is disposed between the first conductive plate and the plurality of first conductive pillars, and wherein the first high-k block comprises a material having a dielectric constant that is different than a dielectric constant of the insulating material.

20 Claims, 21 Drawing Sheets

(51) Int. Cl.
*H10W 74/01* (2026.01)
*H10W 74/10* (2026.01)
*H10W 74/15* (2026.01)
*H10W 90/00* (2026.01)

(52) U.S. Cl.
CPC .......... *H10W 74/117* (2026.01); *H10W 74/15* (2026.01); *H10W 90/724* (2026.01); *H10W 90/734* (2026.01)

(58) Field of Classification Search
CPC . H10W 74/117; H10W 74/15; H10W 90/724; H10W 90/734; H10W 70/09; H10W 72/851; H10W 70/05; H10W 70/60; H10W 70/614; H10W 74/019; H10W 90/701; H10W 74/014; H10P 72/7416; H10P 72/7424; H10P 72/743; H10P 72/74
USPC .......................................................... 343/904
See application file for complete search history.

(56) References Cited

U.S. PATENT DOCUMENTS

| | | | | |
|---|---|---|---|---|
| 9,048,233 | B2 | 6/2015 | Wu et al. | |
| 9,064,879 | B2 | 6/2015 | Hung et al. | |
| 9,111,949 | B2 | 8/2015 | Yu et al. | |
| 9,263,511 | B2 | 2/2016 | Yu et al. | |
| 9,281,254 | B2 | 3/2016 | Yu et al. | |
| 9,368,460 | B2 | 6/2016 | Yu et al. | |
| 9,372,206 | B2 | 6/2016 | Wu et al. | |
| 9,496,189 | B2 | 11/2016 | Yu et al. | |
| 11,004,799 | B2 | 5/2021 | Wu et al. | |
| 11,024,979 | B2 | 6/2021 | Liao et al. | |
| 11,749,625 | B2 * | 9/2023 | Kuo | H01Q 1/2283 257/428 |
| 2020/0105653 | A1 * | 4/2020 | Elsherbini | G05F 1/46 |
| 2020/0365455 | A1 | 11/2020 | Liao et al. | |
| 2022/0069453 | A1 * | 3/2022 | Yun | H01Q 1/38 |
| 2022/0392855 | A1 * | 12/2022 | Darmawikarta | H10W 42/00 |

OTHER PUBLICATIONS

S. K. Koul, “Technologies for RF to Millimeter Wave Circuits,” 2006 International RF and Microwave Conference, Putra Jaya, Malaysia, Sep. 2006, pp. 5-9.

Kuo et al., “A Fully SiP Integrated V -Band Butler Matrix End-Fire Beam-Switching Transmitter Using Flip-Chip Assembled CMOS Chips on LTCC,” in IEEE Transactions on Microwave Theory and Techniques, vol. 60, No. 5, May 2012, pp. 1424-1436.

* cited by examiner

ANTENNA APPARATUS AND METHOD

CROSS-REFERENCE TO RELATED APPLICATIONS

This application is a continuation of U.S. application Ser. No. 17/864,765, filed on Jul. 14, 2022, which application is hereby incorporated herein by reference.

BACKGROUND

In modern semiconductor devices and systems, integration and miniaturization of components have progressed at an increasingly rapid pace. In wireless applications, one of the growing challenges encountered by the integration process is the disposition of radio frequency devices or antennas. Conventional antennas associated with integrated circuits are usually designed with limited performance and capability due to the competing objective of size reduction. Thus, an improved integrated antenna structure is desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
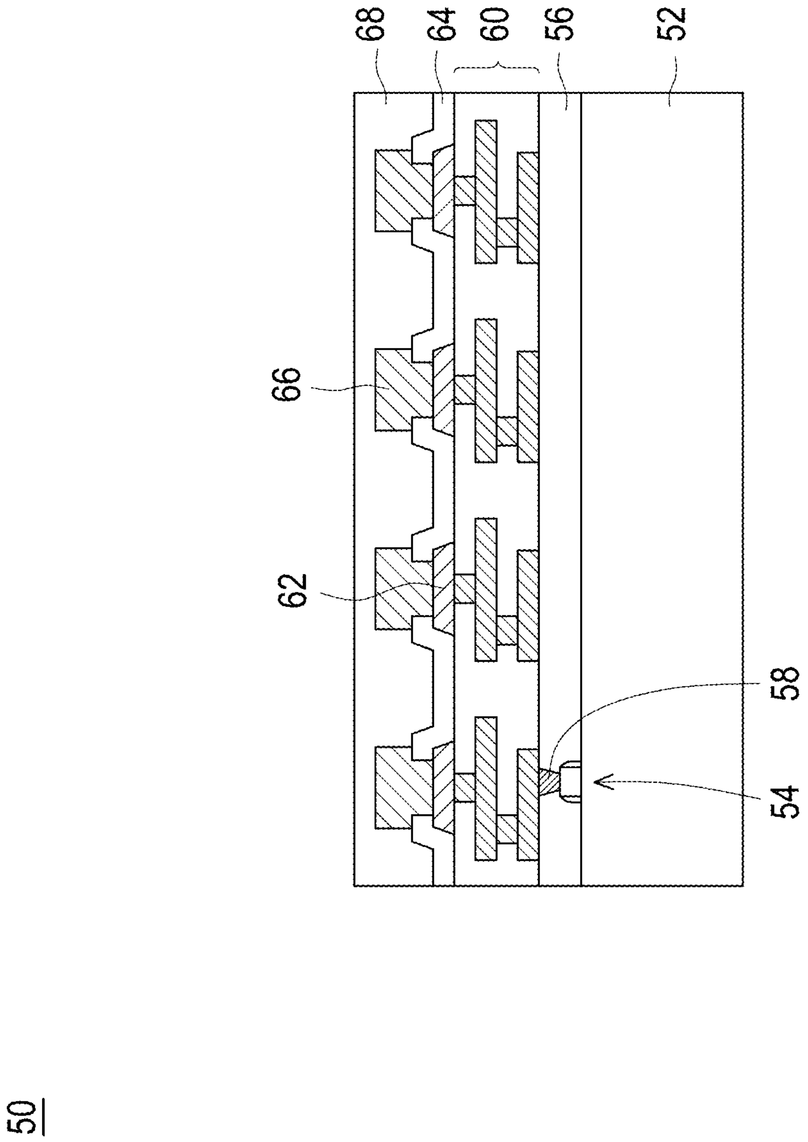
FIG. 1 illustrates a cross-sectional view of an integrated circuit die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods applied to forming an integrated circuit package comprising vertical Through Insulator Via (TIV) plates and TIV gratings. A high-k block is embedded in the insulator between each TIV plate and a respective TIV grating to form an antenna oscillation cavity. Each high-k block is comprised of a material that has a dielectric constant that is equal to or greater than 3.9, and the dielectric constant of each high-k block is different from dielectric constants of the other high-k blocks. In addition, a spacing between each TIV plate and its respective TIV grating may be varied. Advantageous features of one or more embodiments disclosed herein may allow for high-frequency lateral Radio Frequency (RF) transmission suitable for 5G & 6G high-frequency (e.g., 28, 38, 77, and 120 GHz) RF transceivers, as well as portable, wearable, IoT (internet of things) and smart phone products. In addition, forming antenna oscillation cavities comprising various high-k blocks, wherein each high-k block comprises a material having a different dielectric constant from materials of the other high-k blocks allows for the transmission and receiving of up to at least eight different RF bands with different frequency ranges. For example, a higher weighted average dielectric constant of the combined high-k block and insulator between a TIV plate and its respective TIV grating will allow for the transmission and receiving of a higher RF band. The high-k block being disposed between each TIV plate and its respective TDV grating allows for a reduced size of each antenna oscillation cavity, resulting in a reduction in the size of the integrated circuit package and making it more compact. Further, because the formation process of the TIV plates and the TIV gratings is compatible with current processes, manufacturing costs are reduced and efficiency is increased.

FIG. 1 illustrates a cross-sectional view of an integrated circuit die 50 in accordance with some embodiments. The integrated circuit die 50 will be packaged in subsequent processing to form an integrated circuit package. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, baseband transceiver die, a sensor die, a micro-electro-mechanical-system (MEMS) die, a signal processing die (e.g., digital signal processing (DSP) die), a front-end die (e.g., analog front-end (AFE) dies), a high-performance computing (HPC) die, an artificial intelligence (AI) die, an automotive die, the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices (represented by a transistor) 54 may be formed at the front surface of the semiconductor substrate 52. The devices 54 may be active devices (e.g., transistors, diodes, etc.), capacitors, resistors, etc. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit die 50 further includes pads 62, such as aluminum pads, to which external connections are made. The pads 62 are on the active side of the integrated circuit die 50, such as in and/or on the interconnect structure 60. One or more passivation films 64 are on the integrated circuit die 50, such as on portions of the interconnect structure 60 and pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the integrated circuit die 50.

Optionally, solder regions (e.g., solder balls or solder bumps) may be disposed on the pads 62. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing and are packaged, and dies, which fail the CP testing, are not packaged. After testing, the solder regions may be removed in subsequent processing steps.

A dielectric layer 68 may (or may not) be on the active side of the integrated circuit die 50, such as on the passivation films 64 and the die connectors 66. The dielectric layer 68 laterally encapsulates the die connectors 66, and the dielectric layer 68 is laterally coterminous with the integrated circuit die 50. Initially, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may bury the solder regions as well. Alternatively, the solder regions may be removed prior to forming the dielectric layer 68.

The dielectric layer 68 may be a polymer such as polybenzoxazole (PBO), polyimide, benzocyclobutene (BCB), or the like; a nitride such as silicon nitride or the like; an oxide such as silicon oxide, PSG, BSG, BPSG, or the like; the like, or a combination thereof. The dielectric layer 68 may be formed, for example, by spin coating, lamination, chemical vapor deposition (CVD), or the like. In some embodiments, the die connectors 66 are exposed through the dielectric layer 68 during formation of the integrated circuit die 50. In some embodiments, the die connectors 66 remain buried and are exposed during a subsequent process for packaging the integrated circuit die 50. Exposing the die connectors 66 may remove any solder regions that may be present on the die connectors 66.

FIGS. 2 through 14B illustrate cross-sectional views and top-down views of intermediate steps during a process for forming a first package component 100, in accordance with some embodiments. A first package region 100A and a second package region 100B are illustrated, and one or more of the integrated circuit dies 50 are packaged to form an integrated circuit package in each of the package regions 100A and 100B. The integrated circuit packages may also be referred to as integrated fan-out (InFO) packages.

Figure 2:
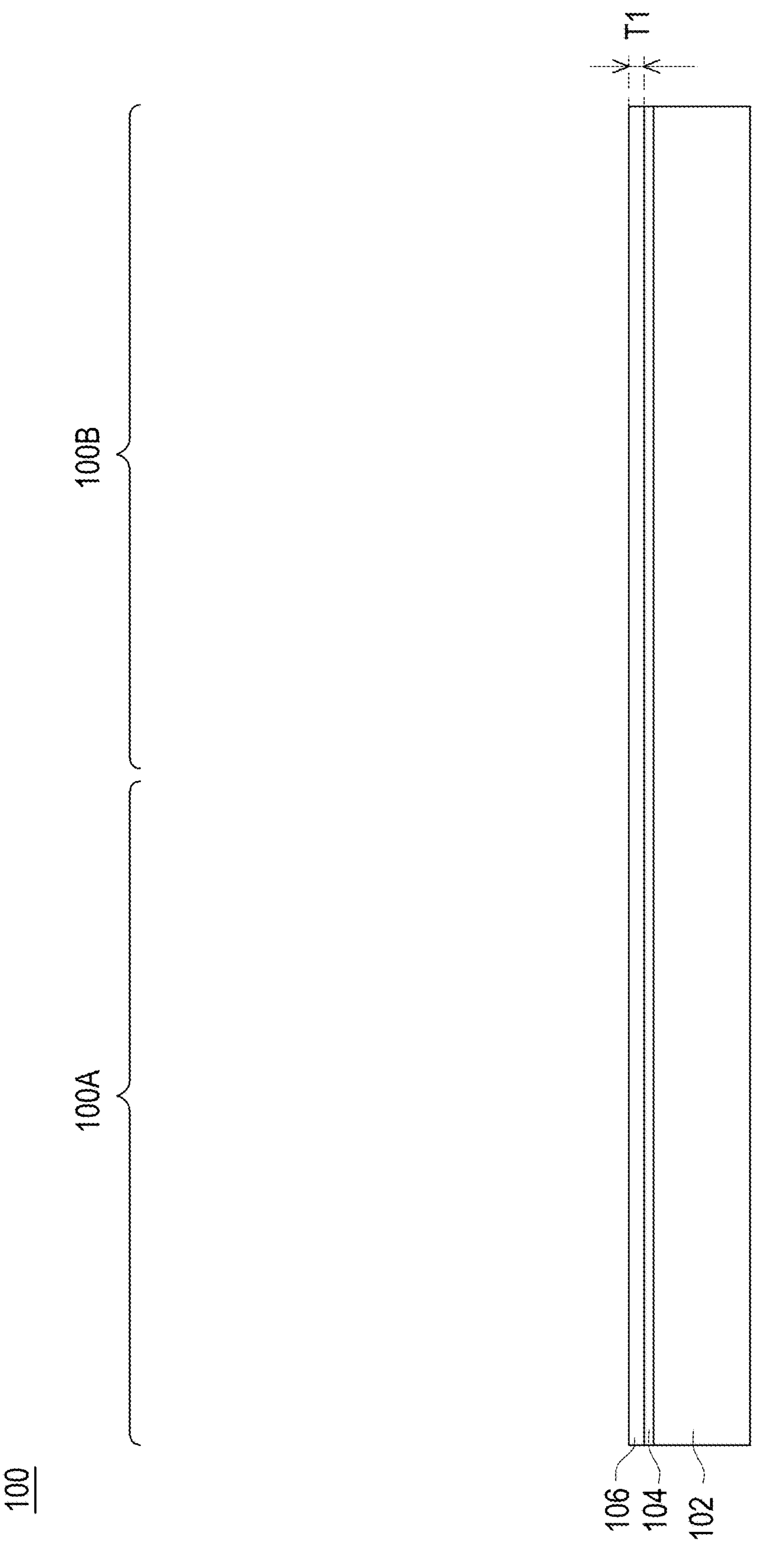
FIGS. 2 through 14B illustrate cross-sectional views and a top-down view of intermediate steps during a process for forming a package component in accordance with some embodiments.

In FIG. 2, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Still referring to FIG. 2, a dielectric layer 106 is formed on the release layer 104. The dielectric layer 106 may be, for example, a layer of polymer material such as, e.g., polybenzoxazole (PBO), polyimide (PI), benzocyclobutene (BCB), or other polymer material that is electrically insulating. The dielectric layer 106 may be formed using a process such as lamination, coating, (e.g., spin-coating), chemical vapor deposition (CVD), or the like. In some embodiments, the dielectric layer 106 may comprise a glass, a spin-on glass (SOG), a ceramic, low temperature co-fired ceramic (LTCC), silicon oxide, silicon nitride, silicon carbide, silicon oxynitride, or the like. In an embodiment, the dielectric layer 106 may have a thickness T1 that is in a range from 5 μm to 50 μm.

Figure 3:
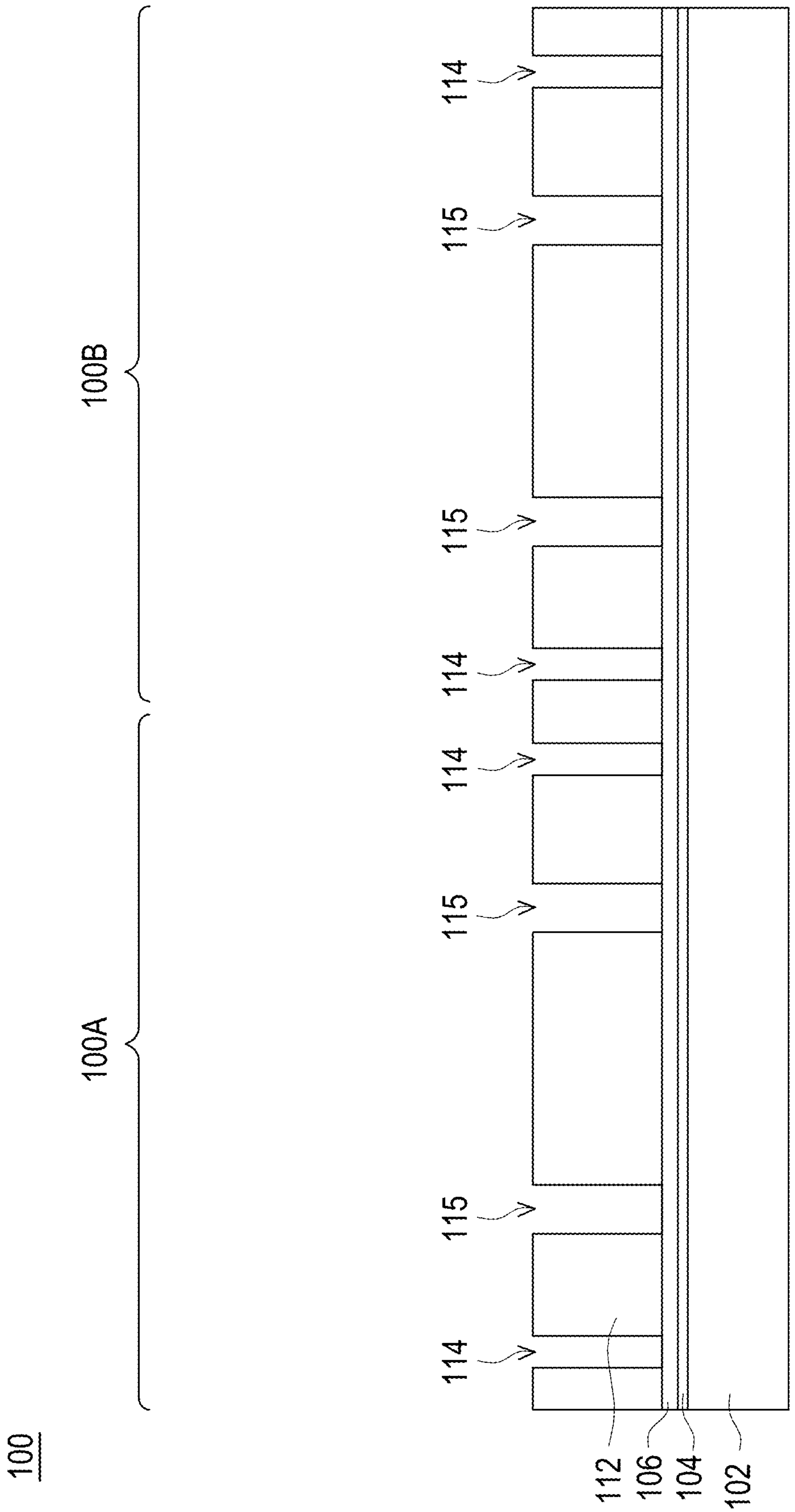

In FIG. 3, a mask layer 112 is formed over the structure shown in FIG. 2, such as over the dielectric layer 106. The mask layer 112 may be a dry-film photoresist, or the like, and may be formed using a lamination process. In an embodiment, the mask layer 112 may be formed to have a thickness that is in a range from 120 μm to 300 μm. The mask layer 112 may be patterned using acceptable development and exposure techniques to form first openings (or through holes) 114 and second openings 115 in which to subsequently form vias that are electrically conductive (which may also be called through-insulator-vias TIVs), according to some embodiments. These vias comprise the subsequently formed TIV gratings 120 (shown in FIG. 5) and TIV plates 121 (shown in FIG. 5). The first openings 114 and the second openings 115 may expose top surfaces of the dielectric layer 106.

Figure 4:
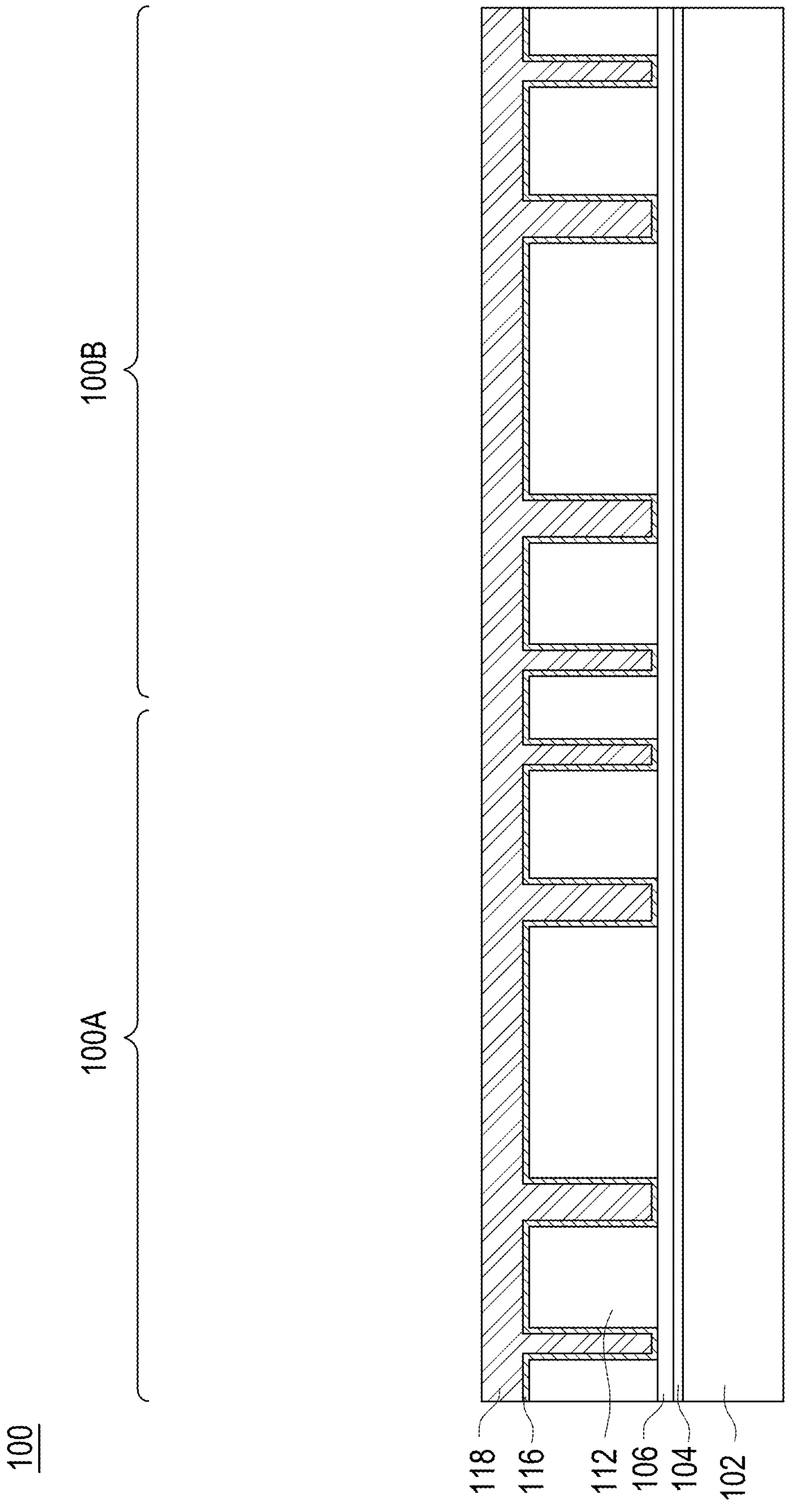

In FIG. 4, a seed layer 116 is formed on the mask layer 112 and in the first openings 114 and the second openings 115 of the mask layer 112, such as on bottom surfaces and sidewalls of the first openings 114, and bottom surfaces and sidewalls of the second openings 115. The metal seed layer 116 may comprise, for example, a Ti/Cu bilayer, a copper layer, or other suitable metal layer, and may be deposited using a PVD process, or the like. Any suitable thickness may be used for the seed layer 116. For example, in some embodiments, the seed layer 116 may comprise at least 1000 Å of titanium and at least 5000 Å of copper. In other embodiments, the seed layer 116 may comprise other combinations of metals and thicknesses. A conductive material 118 is formed on the seed layer 116 and in the first openings 114 and the second openings 115, in order to fill in the first openings 114 and the second openings 115. The conductive material 118 may be a copper layer or other suitable metal formed by an electrochemical plating (ECP) process, or the like. During the ECP process, the conductive material 118 is deposited both laterally on the sidewalls of the first openings 114 and the second openings 115, as well as vertically on bottom surfaces of the first openings 114 and the second openings 115.

Figure 5:
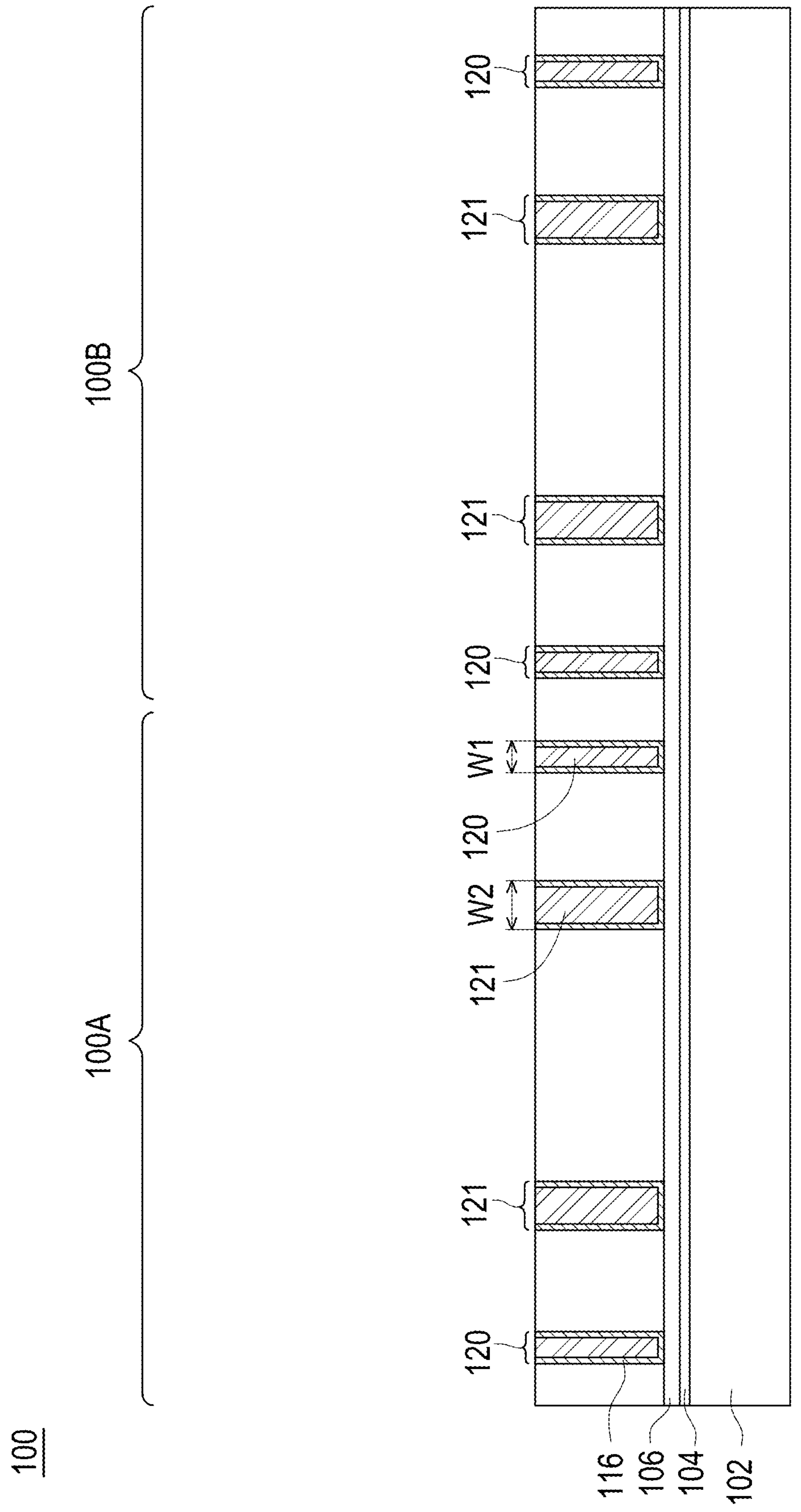

In FIG. 5, a planarization step, such as a chemical mechanical polish (CMP), or the like, may be performed to remove portions of the seed layer 116 and excess portions of the conductive material 118 which are over the mask layer 112. The remaining conductive material 118 and the seed layer 116 in the first openings 114 form the TIV gratings 120. The remaining conductive material 118 and the seed layer 116 in the second openings 115 form the TIV plates 121. Accordingly, after the planarization step, top surfaces of the conductive material 118, the seed layer 116, and the mask layer 112 are level. In an embodiment, each of the TIV gratings 120 may have a width W1 that is in a range from 50 μm to 1000 μm. In an embodiment, each of the TIV plates 121 may have a width W2 that may be in a range from 50 μm to 1000 μm. In an embodiment, the width W2 of the TIV plates 121 may be larger than the width W1 of the TIV gratings 120.

Figure 6:
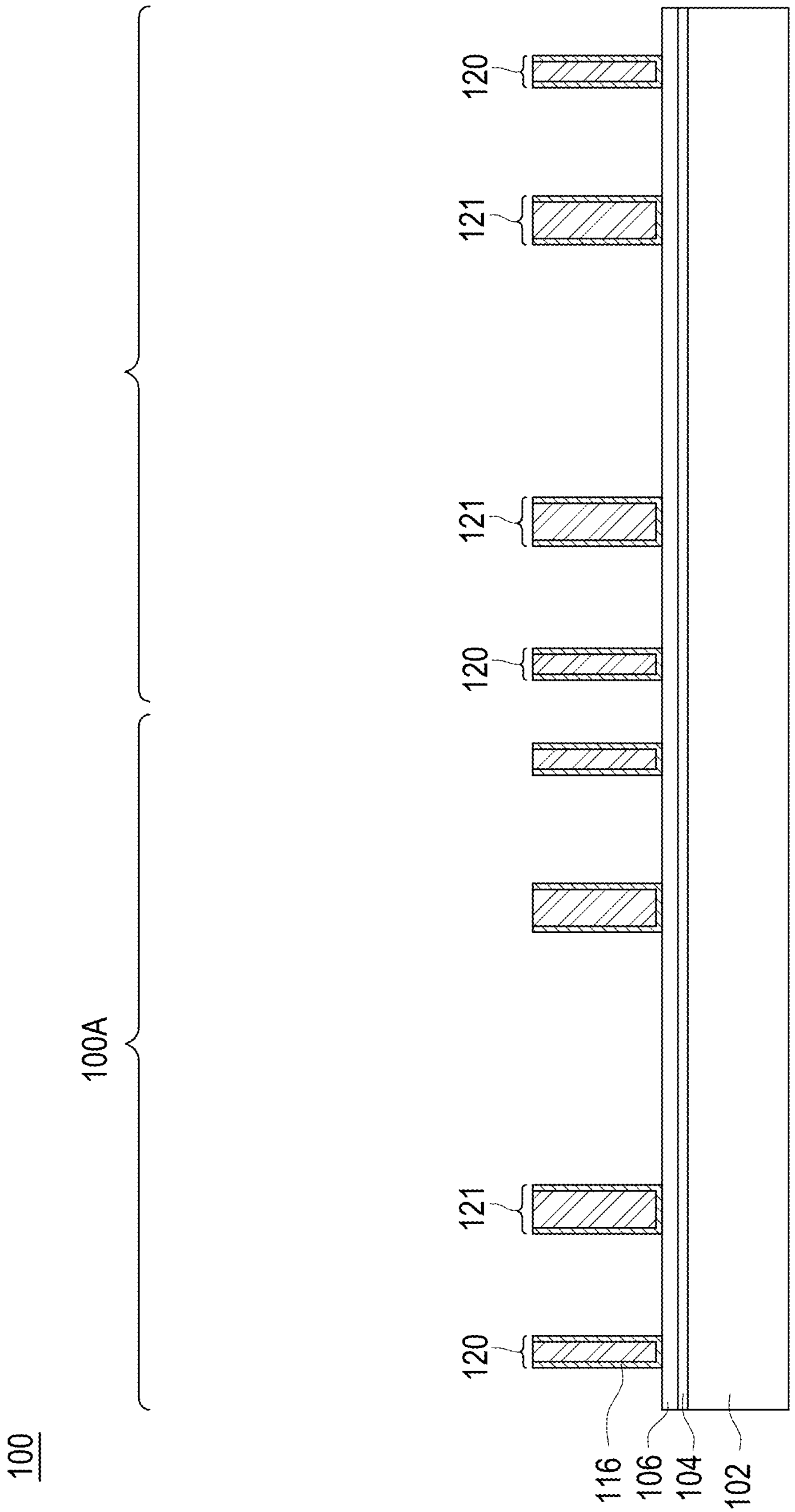

In FIG. 6, after the planarization step, the mask layer 112 may be removed using a suitable removal process such as ashing or chemical stripping.

Figure 7A:
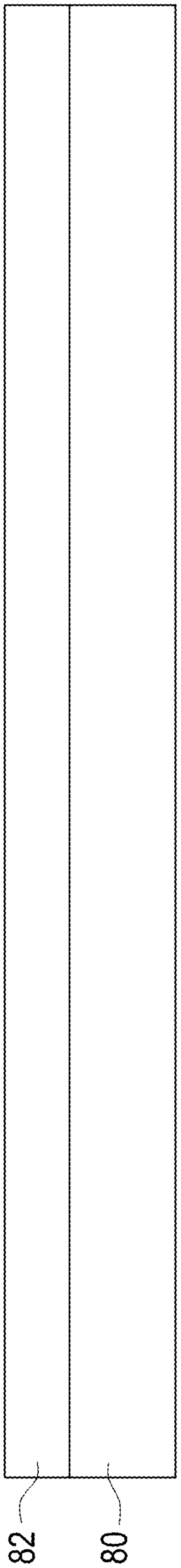

In FIGS. 7A through 7E, a plurality of high-k blocks 126 and a plurality of integrated circuit dies 50 are bonded to a top surface of the dielectric layer 106 using, for example, a pick and place process, a carrier bonding process, or the like. An example carrier bonding process is illustrated in FIGS. 7A through 7E, but other pick and place processes are also possible for placing the plurality of high-k blocks 126 and the plurality of integrated circuit dies 50. In FIG. 7A, a carrier substrate 80 is shown. The carrier substrate 80 may comprise silicon-based materials, such as a silicon substrate (e.g., a silicon wafer), a glass material, silicon oxide, or other materials, such as aluminum oxide, the like, or a combination. The carrier substrate 80 may comprise a transparent material such as glass, or the like. An adhesive layer 82 is formed on the carrier substrate 80 to facilitate a subsequent debonding of the carrier substrate 80 from the first package component 100. The adhesive layer 82 may comprise a polymer-based material, which may be removed along with the carrier substrate 80 from the first package component 100. In some embodiments, the adhesive layer 82 may comprise an epoxy-based thermal-release material, which loses its adhesive property when heated, such as a Light-to-Heat-Conversion (LTHC) release coating. In some embodiments, the adhesive layer 82 may comprise an ultra-violet (UV) glue, which loses its adhesive property when exposed to UV light. After the adhesive layer 82 is formed, a suitable curing process may be performed to harden the adhesive material 82.

Figure 7B:
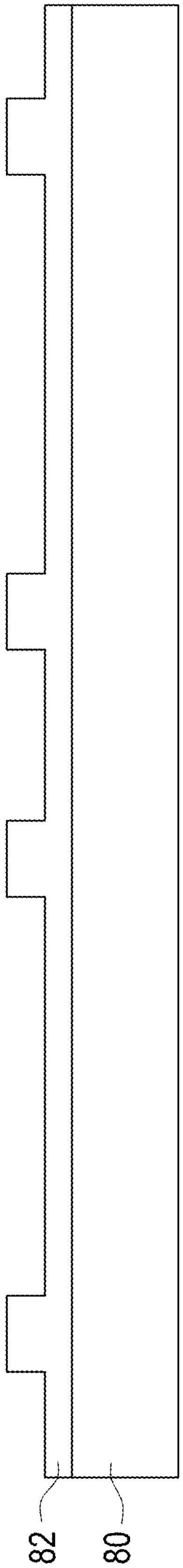

In FIG. 7B, a mask layer (e.g., a photoresist) is formed over the adhesive layer 82. The mask layer is patterned using suitable development and exposure techniques to form openings in the mask layer that expose top surfaces of the adhesive layer 82. A suitable etching process (e.g., an anisotropic etching process) is then performed to partially etch exposed portions of the adhesive layer 82 using the mask layer as an etching mask. As a result, the adhesive layer 82 may comprise regions with different thicknesses, and the thicknesses can be controlled by varying the parameters of the etching process. After the etching process is performed on the adhesive layer 82, the mask layer may then be removed using an acceptable ashing or stripping process. Although FIG. 7B illustrates an adhesive layer 82 with two different thicknesses, one or more photolithography and etching processes may be used to pattern an adhesive layer 82 with any number of different thicknesses.

Figure 7C:
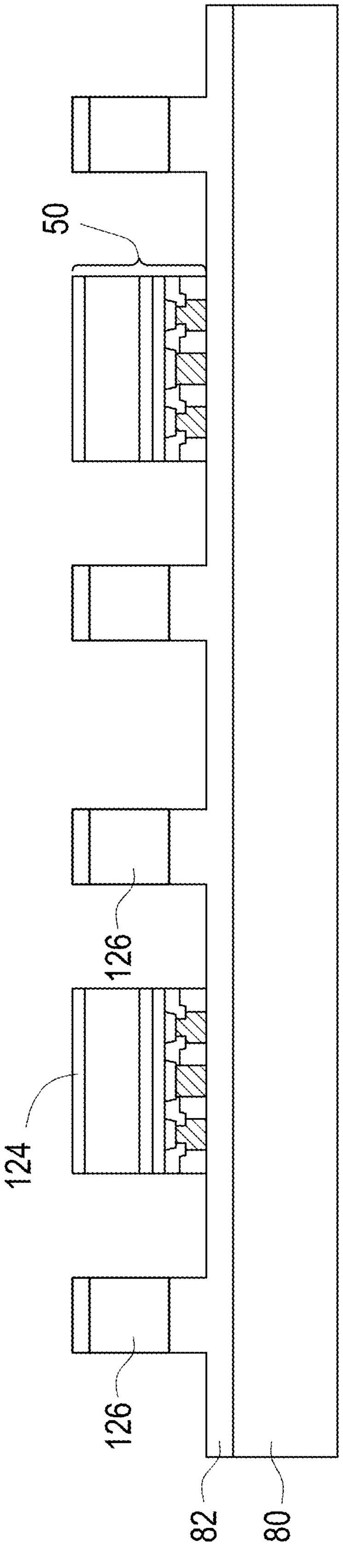

In FIG. 7C, the plurality of high-k blocks 126 and the plurality of integrated circuit dies 50 are attached to a top surface of the adhesive layer 82 using, for example, a pick and place process, or the like. The plurality of integrated circuit dies 50 are attached to the adhesive layer 82 such that the dielectric layer 68 of each of the plurality of integrated circuit dies 50 faces the adhesive layer 82. The plurality of high-k blocks 126 may be disposed on regions of the adhesive layer 82 that have larger heights than the regions of the adhesive layer 82 on which the plurality of integrated circuit dies 50 are disposed on. As a result, topmost surfaces of the plurality of high-k blocks 126 and topmost surfaces of the plurality of integrated circuit dies 50 are level. The plurality of integrated circuit dies 50 and the plurality of high-k blocks 126 may also comprise a die attach films (DAF) 124 that are disposed on top surfaces of the plurality of integrated circuit dies 50 and the plurality of high-k blocks 126. The DAF 124 may comprise a polymer material.

Figure 7D:
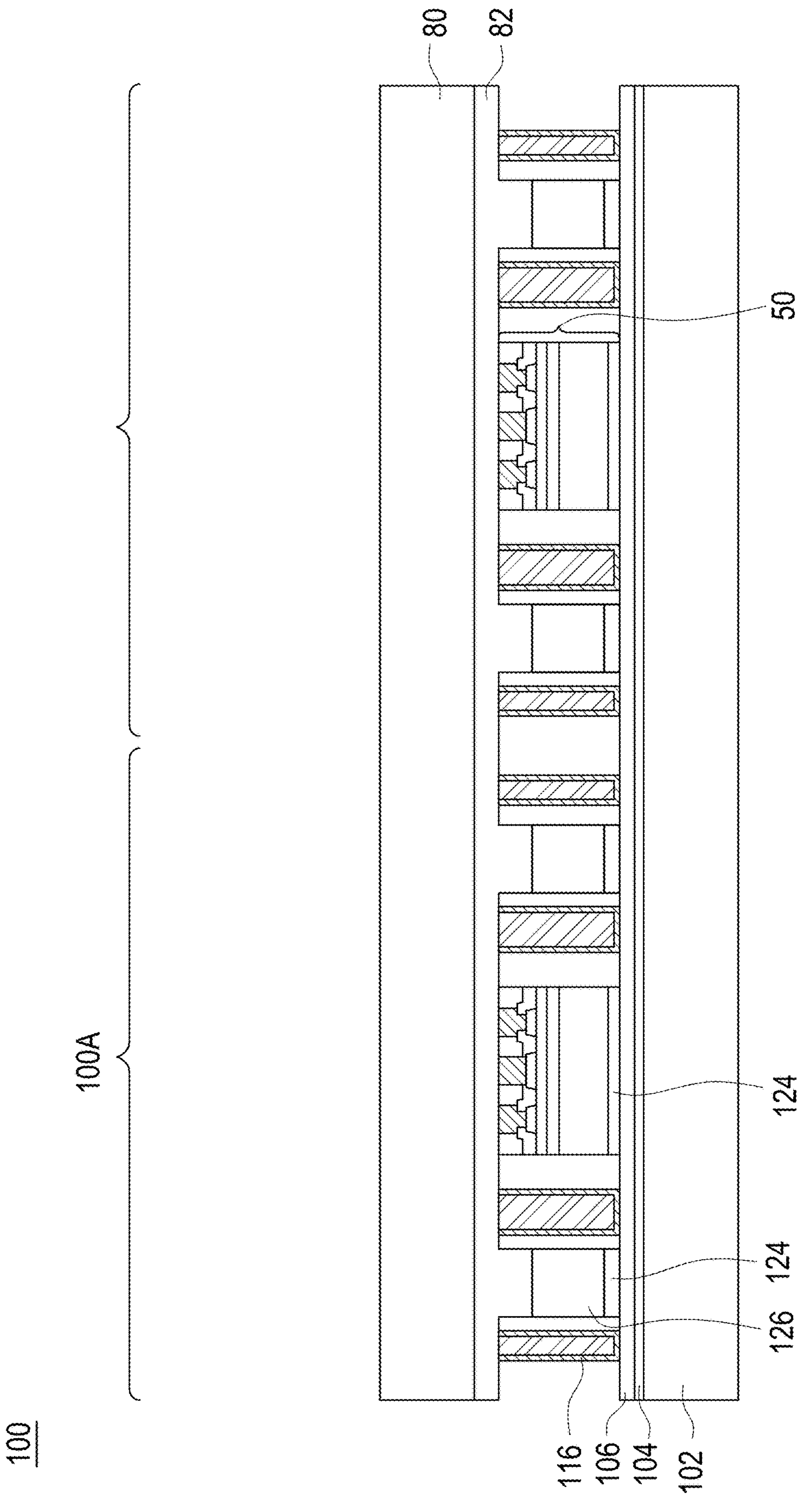

In FIG. 7D, the carrier substrate 80 and the first package component 100 are then transported to a bond chamber where the carrier substrate 80 is oriented to align the plurality of high-k blocks 126 and the plurality of integrated circuit dies 50 with the TIV gratings 120 and the TIV plates 121, such that the plurality of high-k blocks 126 and the plurality of integrated circuit dies 50 face the dielectric layer 106. The plurality of high-k blocks 126 and the plurality of integrated circuit dies 50 are pressed against the dielectric layer 106 to couple the plurality of high-k blocks 126 and the plurality of integrated circuit dies 50 to the dielectric layer 106 using the die attach films (DAFs) 124. A first anneal process is then performed in the bond chamber to initiate bonding of the DAF films 124 with the dielectric layer 106. As a result, the plurality of high-k blocks 126 and the plurality of integrated circuit dies 50 are adhered to the dielectric layer 106. The first anneal may be performed at a temperature in a range from 150° C. to 350° C. and for a duration of time that is in a range from 0.5 hours to 4 hours.

Figure 7E:
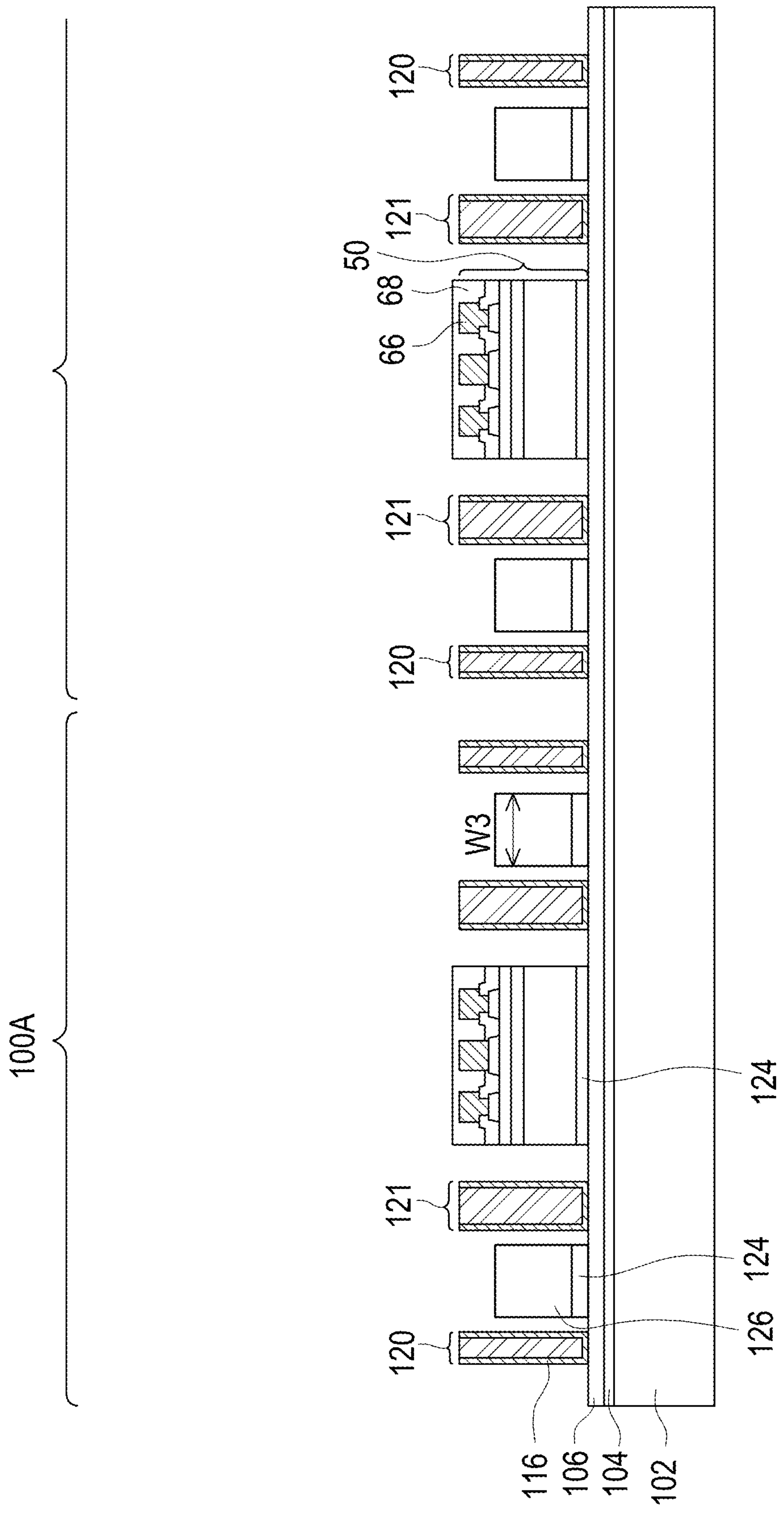

In FIG. 7E, a de-bonding of the carrier substrate 80 is then performed to detach (or "de-bond") the carrier substrate 80 from the plurality of high-k blocks 126 and the plurality of integrated circuit dies 50. In accordance with some embodiments, the de-bonding includes projecting a light such as a laser light or an UV light on the adhesive layer 82 so that the adhesive layer 82 decomposes under the heat of the light. The carrier substrate 80 can then be mechanically removed leaving the plurality of high-k blocks 126 and the plurality of integrated circuit dies 50 bonded to the dielectric layer 106. After the removal of the carrier, a second anneal may be performed at a temperature in a range from 150° C. to 350° C. and for a duration of time that is in a range from 0.5 hours to 4 hours. The second anneal strengthens the bonding between the plurality of high-k blocks 126 and the dielectric layer 106. The second anneal also strengthens the bonding between the plurality of integrated circuit dies 50 and the dielectric layer 106. In other embodiments, the second anneal maybe performed before the removal of the carrier. Although FIGS. 7A though 7E illustrate that the plurality of high-k blocks 126 and the plurality of integrated circuit dies 50 are bonded to the top surface of the dielectric layer 106 simultaneously using the carrier substrate 80, the plurality of integrated circuit dies 50 may be bonded to the top surface of the dielectric layer 106 either prior to or after the plurality of high-k blocks 126 are bonded to the top surface of the dielectric layer 106. In such a case, the bonding of the plurality of integrated circuit dies 50 to the top surface of the dielectric layer 106 may be performed with a first carrier substrate, and the bonding of the plurality of high-k blocks 126 to the top surface of the dielectric layer 106 may be performed with a second carrier substrate different from the first carrier substrate.

In an embodiment, each of the plurality of high-k blocks 126 may be disposed between a TIV grating 120 and respective TIV plate 121.

Each of the plurality of high-k blocks 126 may comprise a width W3 that is in a range from 10 μm to 100 μm. Each of the plurality of high-k blocks 126 comprises a material having a dielectric constant value that is equal to or greater than 3.9. In an embodiment, each of the plurality of high-k blocks 126 comprises a material having a dielectric constant value of up to 20,000. In an embodiment, each of the plurality of high-k blocks 126 may comprise a different material from materials of the other high-k blocks of the plurality of high-k blocks 126. Further, each of the plurality of high-k blocks 126 may comprise a material having a dielectric constant that is different from the dielectric constants of materials of the other high-k blocks of the plurality of high-k blocks 126. The plurality of high-k blocks 126 may comprise $SiO_2$, $Si_3N_4$, $Al_2O_3$, $Y_2O_3$, $TiO_2$, $HfO_2$, $ZrO_2$, $PbZrTiO_3$, $BaTiO_3$, $BaSrTiO_3$, $SrTiO_3$, or the like. In an embodiment, one or more of the plurality of high-k blocks 126 may have a cube shape having a length, a width, and a height all being equal to each other. In an embodiment, one or more of the plurality of high-k blocks 126 may have a cuboid shape, wherein at least one of a length, a width, or a height is not equal to the other dimensions of the cuboid.

Figure 8:
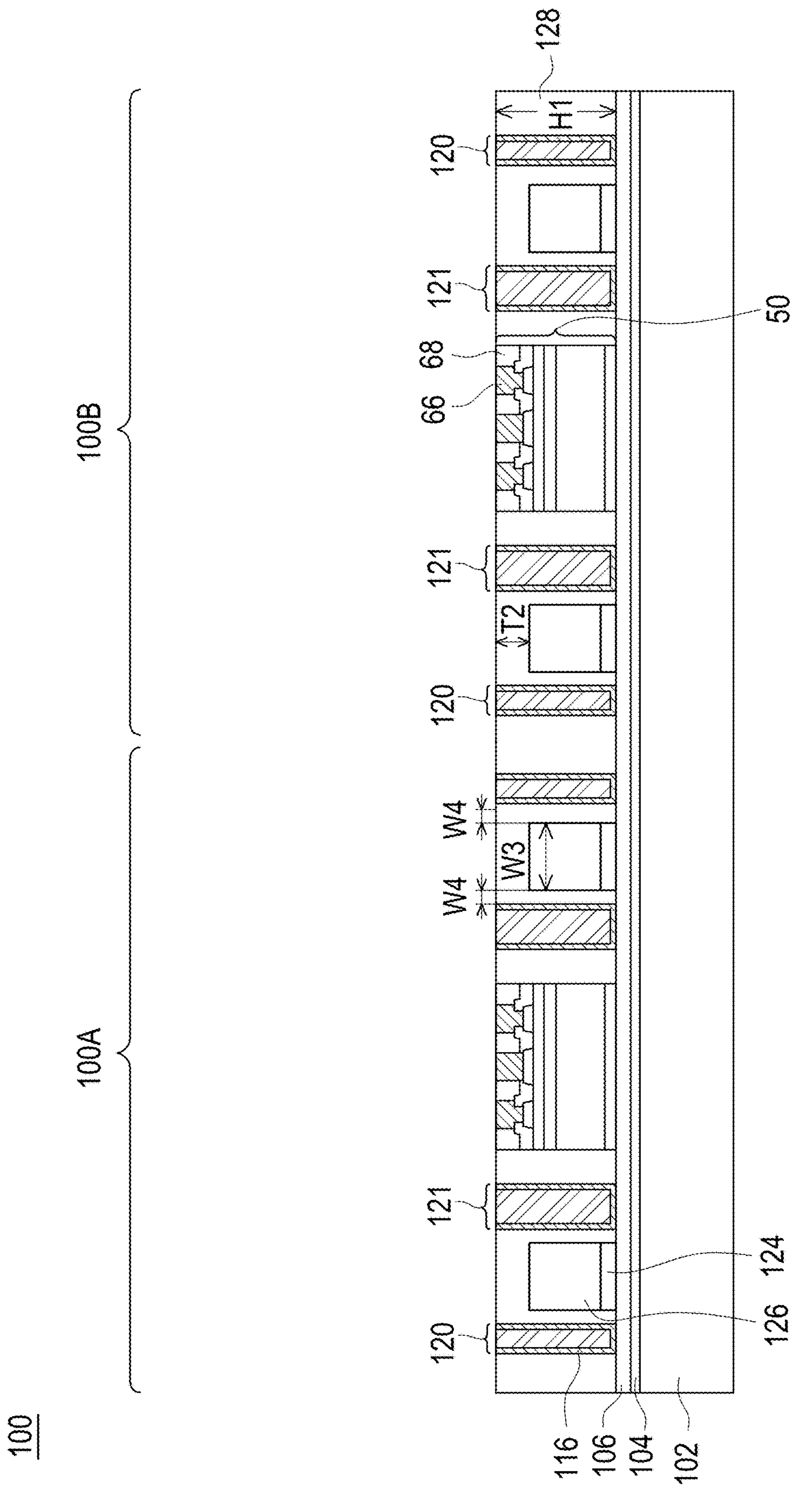

In FIG. 8, an electrically insulating molding material (or molding compound) 128 is formed over the structure shown in FIG. 7E, such as on top surfaces and sidewalls of the TIV gratings 120, top surfaces and sidewalls of the TIV plates 121, top surfaces and sidewalls of the plurality of the high-k blocks 126, top surfaces and sidewalls of the plurality of integrated circuit dies 50, sidewalls of the die attach film (DAF) 124, and top surfaces of the dielectric layer 106. The molding material 128 can comprise a dielectric material, such as silicon-based material, an epoxy molding compound that includes silica, or the like, that provides electrical isolation between each of the TIV gratings 120 and other structures of the first package component 100. The molding material 128 also provides electrical isolation between each of the TIV plates 121 and other structures of the first package component 100. A dielectric constant of the molding material 128 may be in the range from 50 to 5000 μm. The dielectric constant of the molding material 128 may be different from dielectric constants of the materials of the plurality of the high-k blocks 126. The dielectric constant of the molding material 128 may be smaller than the dielectric constants of the materials of the plurality of the high-k blocks 126. The molding material 128 may be formed using any suitable process, such as, spin-coating, a deposition process, an injection process, or the like. When the molding material 128 is formed using a spin-coating process, a curing process is also performed at a temperature in a range from 150° C. to 210° C., in order to harden the molding material 128. Excess portions of the molding material 128 may then be planarized by grinding and CMP to remove a portion of the molding material 128 and expose top surfaces of the TIV gratings 120 and the TIV plates. During the planarization, a portion of the dielectric layer 68 of each of the plurality of integrated circuit dies 50 may also be removed so as to expose top surfaces of the die connectors 66. As illustrated in FIG. 8, the planarization may result in the top surfaces of the TIV gratings 120, the TIV plates 121, and the die connectors 66 being level with a top surface of the molding material 128. In an embodiment, after the planarization, a height H1 of each of the TIV gratings 120 may be in a range from 120 μm to 300 μm. In an embodiment, after the planarization, a height of the TIV plates 121 may be equal to the height H1. In an embodiment, a height of the molding material 128 may be equal to the height H1. In an embodiment, after the planarization, a thickness T2 of the molding material 128 above a top surface of each of the plurality of the high-k blocks 126 is in a range from 0 μm to 100 μm.

Referring further to FIG. 8, the molding material 128 disposed between a first sidewall of one of the plurality of the high-k blocks 126 and a nearest sidewall of an adjacent TIV grating 120 that faces the first sidewall may have a width W4 that is in a range from 0.1 μm to 100 μm. In addition, the molding material 128 disposed between a second sidewall of the one of the plurality of the high-k blocks 126 and a nearest sidewall of an adjacent TIV plate 121 that faces the second sidewall may have the width W4. A high-k block 126 and molding material 128 disposed between a TIV grating 120 and a respective TIV plate 121 will fill the space between each TIV grating 120 and respective TIV plate 121 (e.g., with insulating materials of the molding material 128 and the high-k block 126), forming an antenna oscillation cavity structure between the TIV grating 120 and the respective TIV plate 121. The combined insulating materials of the molding material 128 and the high-k block 126 between the TIV grating 120 and the respective TIV plate 121 may have a weighted average dielectric constant value that is dependent on the width W4 of the molding material 128 and the width W3 of the high-k block 126. By varying the width W3 of the high-k block 126 and the width W4 of the molding material 128, the weighted average dielectric constant value of the combined insulating materials between the TIV grating 120 and the respective TIV plate 121 can be tuned. For example, using a high-k block 126 with a larger width W3 and also having a reduced width W4 of the molding material 128 will result in a higher weighted average dielectric constant value of the combined insulating materials between the TIV grating 120 and the respective TIV plate 121. Further, using a high-k block 126 with a smaller width W3 and also having an increased width W4 of the molding material 128 will result in a smaller weighted average dielectric constant value of the combined insulating materials between the TIV grating 120 and the respective TIV plate 121. A higher average dielectric constant value of the combined insulating materials between the TIV grating 120 and the respective TIV plate 121 will allow for the transmission and receiving of a higher RF band. Additionally, a smaller average dielectric constant value of the combined insulating materials between the TIV grating 120 and the respective TIV plate 121 will allow for the transmission and receiving of a lower RF band.

In FIGS. 9 through 13, exemplary processing will now be described for providing additional redistribution layers of a front-side redistribution structure 149, conductive connectors 150 to provide for input/output (I/O) to die circuitry, and conductive connectors 152 that allow for the grounding of the TIV gratings 120.

Figure 9:
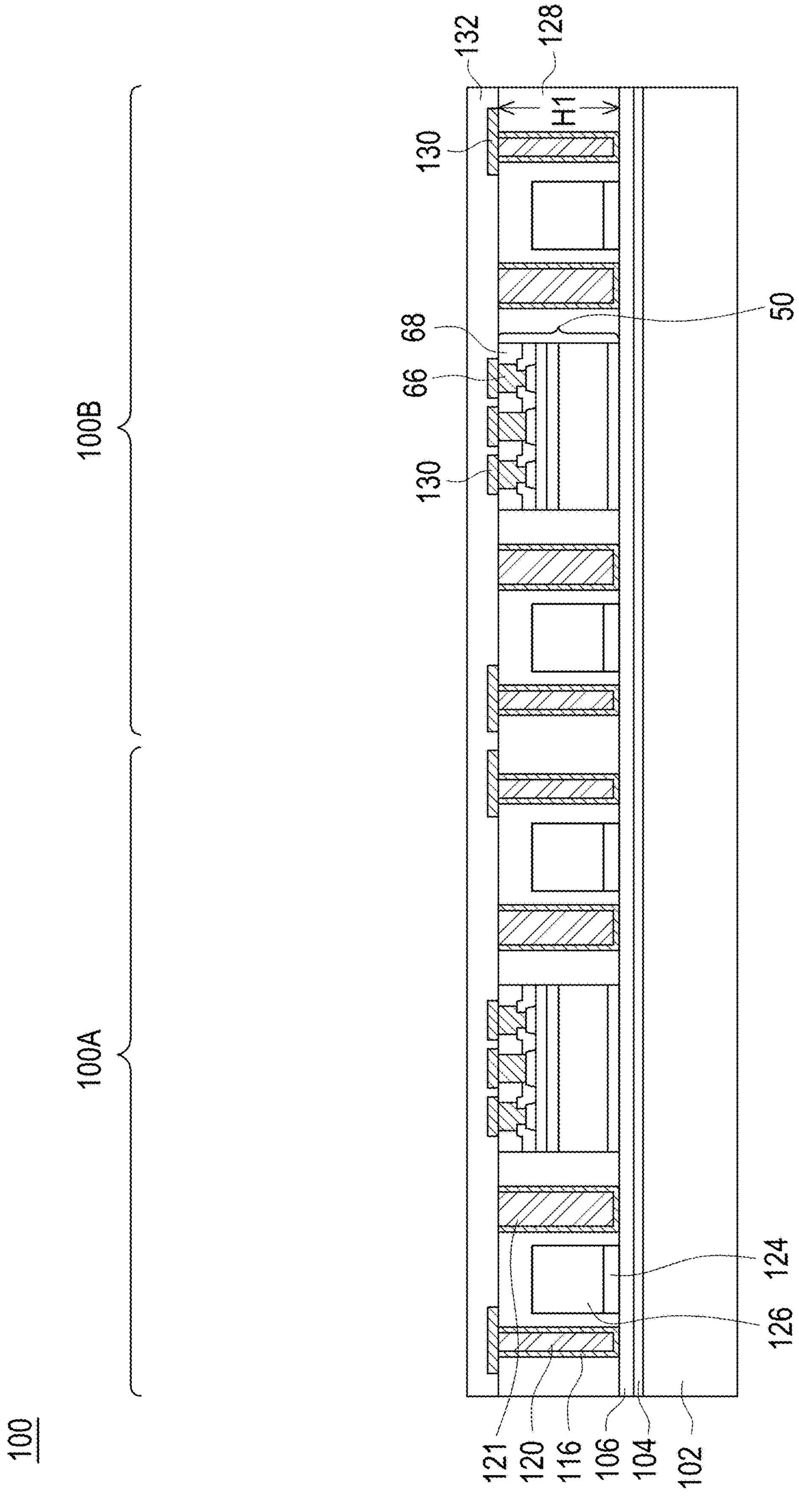

FIG. 9 illustrates the formation of a redistribution layer (RDL) 130 (which also maybe referred to as a metallization pattern) which is part of the front-side redistribution structure 149 shown subsequently in FIG. 13. To form the RDL 130, a seed layer is first formed on top surfaces of the molding material 128, top surfaces of the TIV gratings 120, top surfaces of the TIV plates 121, and top surfaces of the plurality of integrated circuit dies 50. The metal seed layer may comprise, for example, a Ti/Cu bilayer, a copper layer, or other suitable metal layer, and may be deposited using a PVD process (e.g., sputtering) or the like. Any suitable thickness may be used for the seed layer. For example, in some embodiments, the seed layer may comprise at least 1000 Å of titanium and at least 5000 Å of copper. In other embodiments, the seed layer may comprise other combinations of metals and thicknesses. A conductive material layer is then deposited on the seed layer. The conductive material layer may be copper, or the like, that is deposited using a plating process, for example, electroplating, electroless plating, immersion plating, or the like. The seed layer and the conductive material layer may be then be patterned using acceptable photolithography and etching techniques to remove portions of the seed layer and conductive material layer. The remaining portions of the seed layer and overlying conductive material layer form the RDL 130, the RDL 130 being in physical and electrical contact with the die connectors 66 and the TIV gratings 120.

Referring further to FIG. 9, after the formation of the RDL 130, a dielectric layer 132 is formed over the RDL 130, the molding material 128, the TIV gratings 120, the TIV plates 121, and the plurality of integrated circuit dies 50. The dielectric layer 132 is formed such that the RDL 130 is embedded in the dielectric layer 132. The dielectric layer 132 may be, for example, a layer of polymer material such as, e.g., polybenzoxazole (PBO), polyimide (PI), benzocyclobutene (BCB), or other polymer material that is electrically insulating. The dielectric layer 132 may be formed using a process such as lamination, coating, (e.g., spin-coating), chemical vapor deposition (CVD), or the like. In an embodiment, the dielectric layer 106 and the dielectric layer 132 may comprise different materials.

Figure 10:
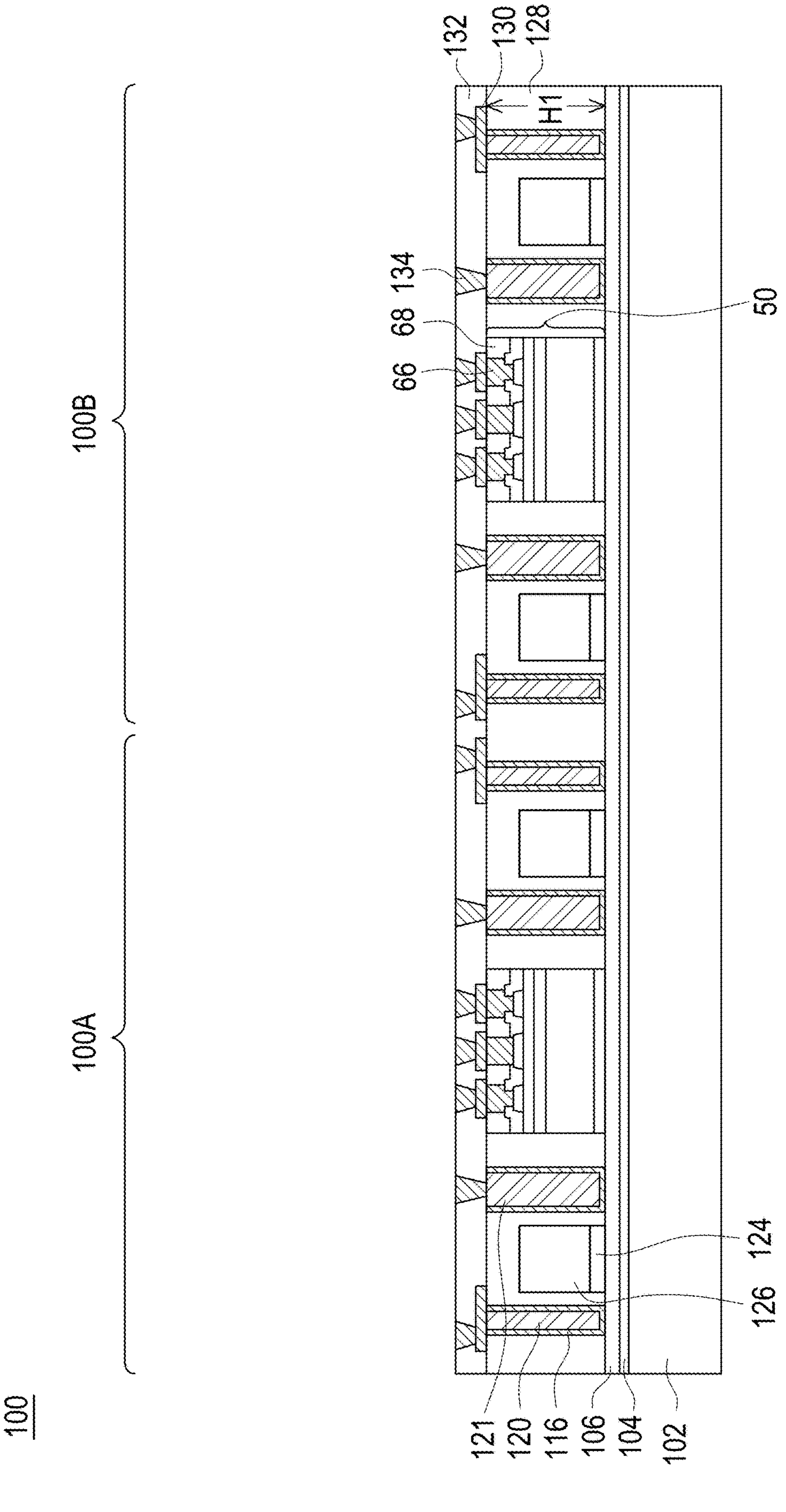

In FIG. 10, a first mask layer (e.g., a photoresist) may be formed over the dielectric layer 132 and subsequently patterned to expose top surfaces of the dielectric layer 132. A suitable etching process is then performed using the first mask layer as an etching mask to form openings in the dielectric layer 132 that expose top surfaces of the RDL 130 and the TIV plates 121. A first seed layer (not shown in FIG. 10) that may comprise a bilayer of Ti/Cu, a copper layer, or other suitable metal layer, may be deposited in the openings in the dielectric layer 132, such as on sidewalls of the openings and on the exposed top surfaces of the RDL 130 and the TIV plates 121. A first conductive material may then be deposited in the openings using a plating process, such as electroplating or electroless plating, in order to fill the openings. The first conductive material may comprise copper, titanium, or the like. The first mask layer may then be removed using an acceptable ashing or stripping process.

After the removal of the first mask layer, a planarization step, such as a chemical mechanical polish (CMP), may be performed to remove excess portions of the first seed layer and the first conductive material that are over top surfaces of the dielectric layer 132. The remaining first seed layer and the first conductive material in the openings forms the vias 134 (which may be referred to as through insulator vias or TIVs). Accordingly, top surfaces of the dielectric layer 132 are level with top surfaces of the vias 134.

Figure 11:
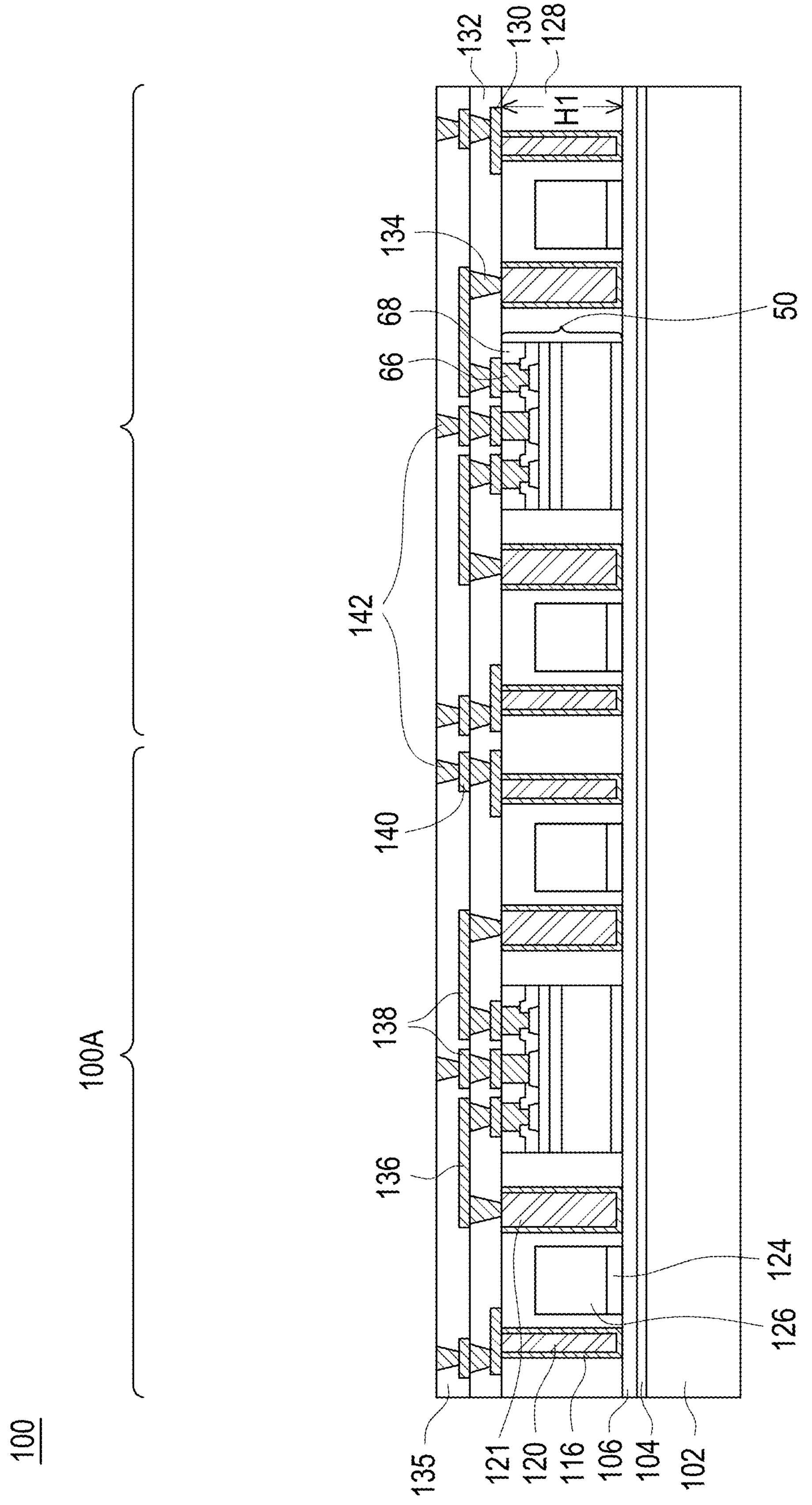

In FIG. 11, a second mask layer (e.g., a photoresist) may then be formed over the dielectric layer 132 and the vias 134. The second mask layer may be patterned to form openings that expose top surfaces of the vias 134. A second seed layer is formed in the openings in the second mask layer. The second seed layer may comprise, for example, a Ti/Cu bilayer, a copper layer, or other suitable metal layer, and may be deposited using a PVD process (e.g., sputtering) or the like. A second conductive material may then be deposited on the second seed layer using a plating process, such as electroplating or electroless plating. The second conductive material may comprise copper, titanium, or the like. The second mask layer may then be removed using an acceptable ashing or stripping process. The second seed layer and the overlying second conductive material form a redistribution layer (RDL) 138 (sometimes referred to as a metallization pattern). The RDL 138 includes feed lines 136 that electrically connect each TIV plate 121 to a die connector 66 of one of the plurality of integrated circuit dies 50. The RDL 138 also includes ground lines 140 that are electrically connected to each TIV grating 120.

Referring further to FIG. 11, a dielectric layer 135 is formed over the dielectric layer 132 and the RDL 138, such that the RDL 138 is embedded in the dielectric layer 135. The dielectric layer 135 may be formed using a similar process and similar materials as those described above in FIG. 9 for the formation of the dielectric layer 132. After the formation of the dielectric layer 135, vias 142 are then formed in the dielectric layer 135 using similar processes and similar materials as those described above in FIG. 10 for the formation of the vias 134. The vias 142 are electrically connected to the TIV gratings 120 and the plurality of integrated circuit dies 50.

Figure 12:
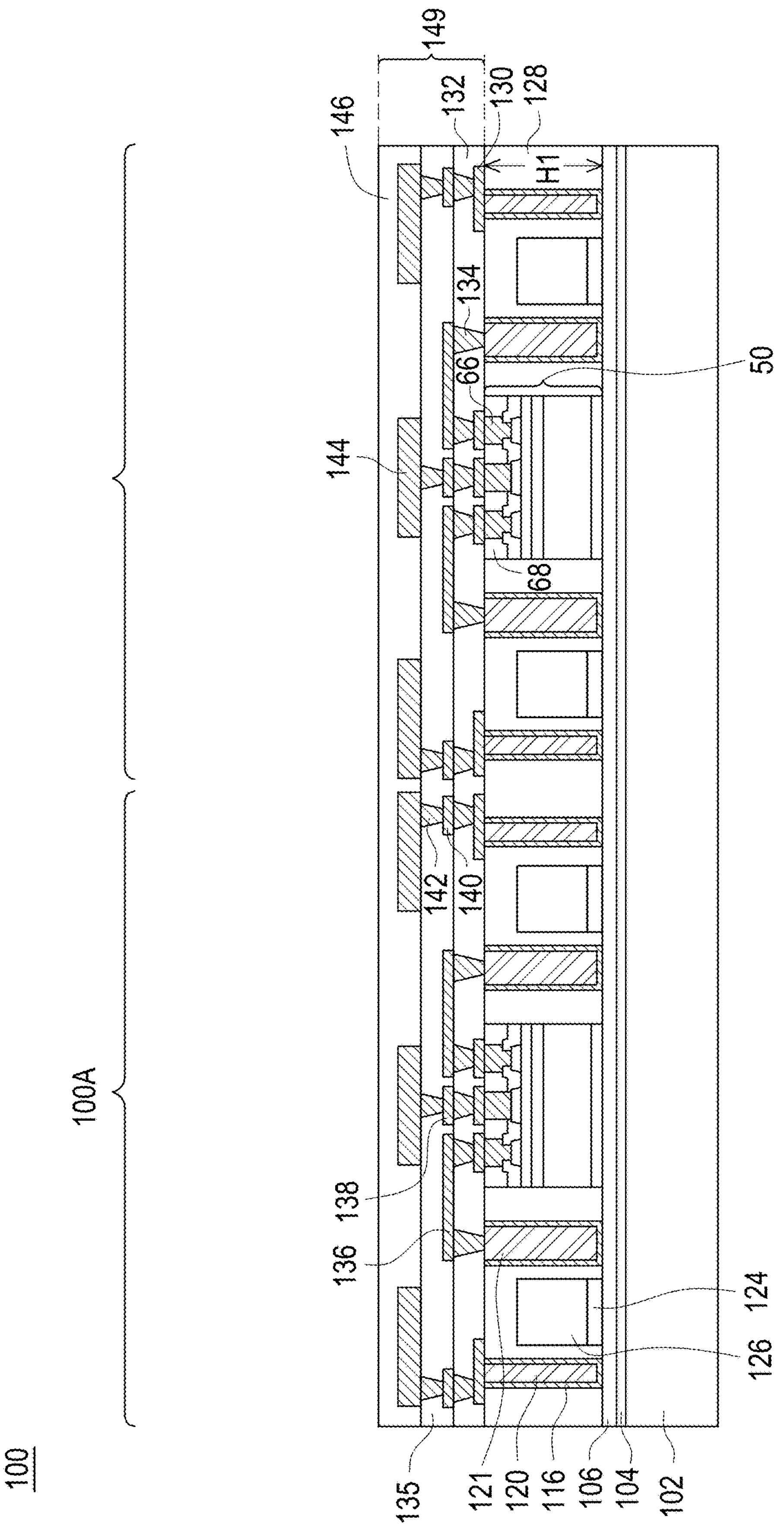

In FIG. 12, a redistribution layer (RDL) 144 (sometimes referred to as a metallization pattern) is formed over the dielectric layer 135 and the vias 142. The RDL 144 is formed using similar processes and similar materials as those described above in FIG. 11 for the formation of the RDL 138. After the formation of the RDL 144, a dielectric layer

146 is formed over the dielectric layer 135 and the RDL 144, such that the RDL 144 is embedded in the dielectric layer 146. The dielectric layer 146 may be formed using a similar process and similar materials as those described above in FIG. 9 for the formation of the dielectric layer 132. The front-side redistribution structure 149 is shown as an example having three layers of metallization patterns. More or fewer dielectric layers and metallization patterns may be formed in the front-side redistribution structure 149. If fewer dielectric layers and metallization patterns are to be formed, steps and process discussed above may be omitted. If more dielectric layers and metallization patterns are to be formed, steps and processes discussed above may be repeated.

Figure 13:
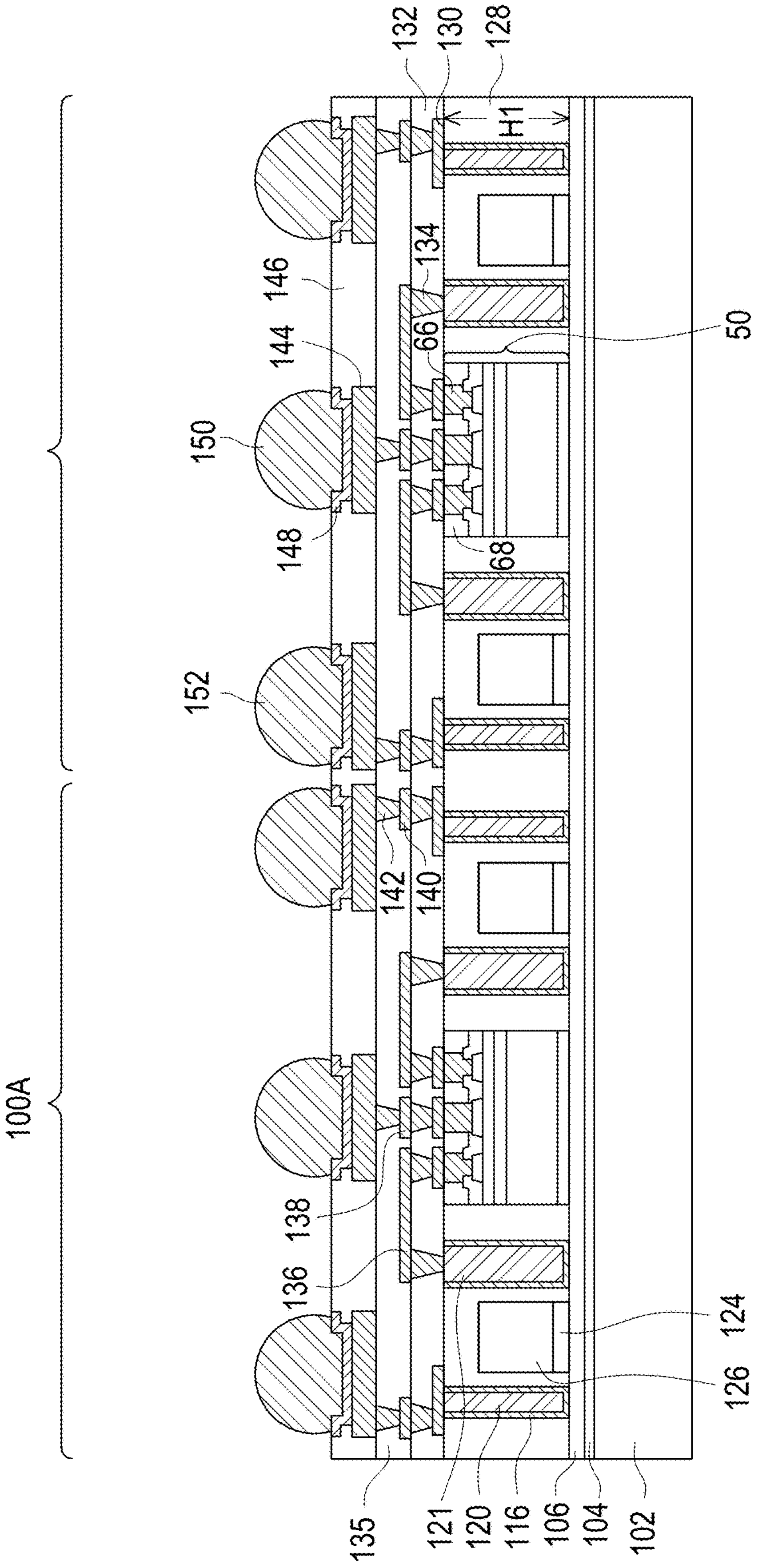

In FIG. 13, the dielectric layer 146 is patterned using acceptable photolithography and etching techniques to form openings in the dielectric layer 146 that expose top surfaces of the RDL 144. A conductive metal such as copper, titanium, or the like, is deposited over the dielectric layer 146 and in the openings in the dielectric layer 146 using for example, sputtering, evaporation, PECVD, or the like. Suitable photolithographic masking and etching process are then used to remove portions of the conductive metal, and the remaining portions of the conductive metal form the under-bump metal (UBM) pads 148. Conductive connectors 150 and conductive connectors 152 are formed on the UBM pads 148. The conductive connectors 150 and the conductive connectors 152 may be solder balls, metal pillars, metal vias, or the like. The conductive connectors 150 and the conductive connectors 152 may include a conductive material such as solder, or the like. In some embodiments, the conductive connectors 150 and the conductive connectors 152 are formed by initially forming a layer of solder through evaporation, electroplating, printing, solder transfer, ball placement, or the like. Once a layer of solder has been formed on the structure, a reflow may be performed in order to shape the material into the desired bump shapes. Each conductive connector 150 is used to provide electrical input/output (I/O) to circuitry of a respective one of the plurality of integrated circuit dies 50. Each conductive connector 152 is electrically connected to a respective TIV grating 120, and allows for the grounding of the respective TIV grating 120.

Figure 14A:
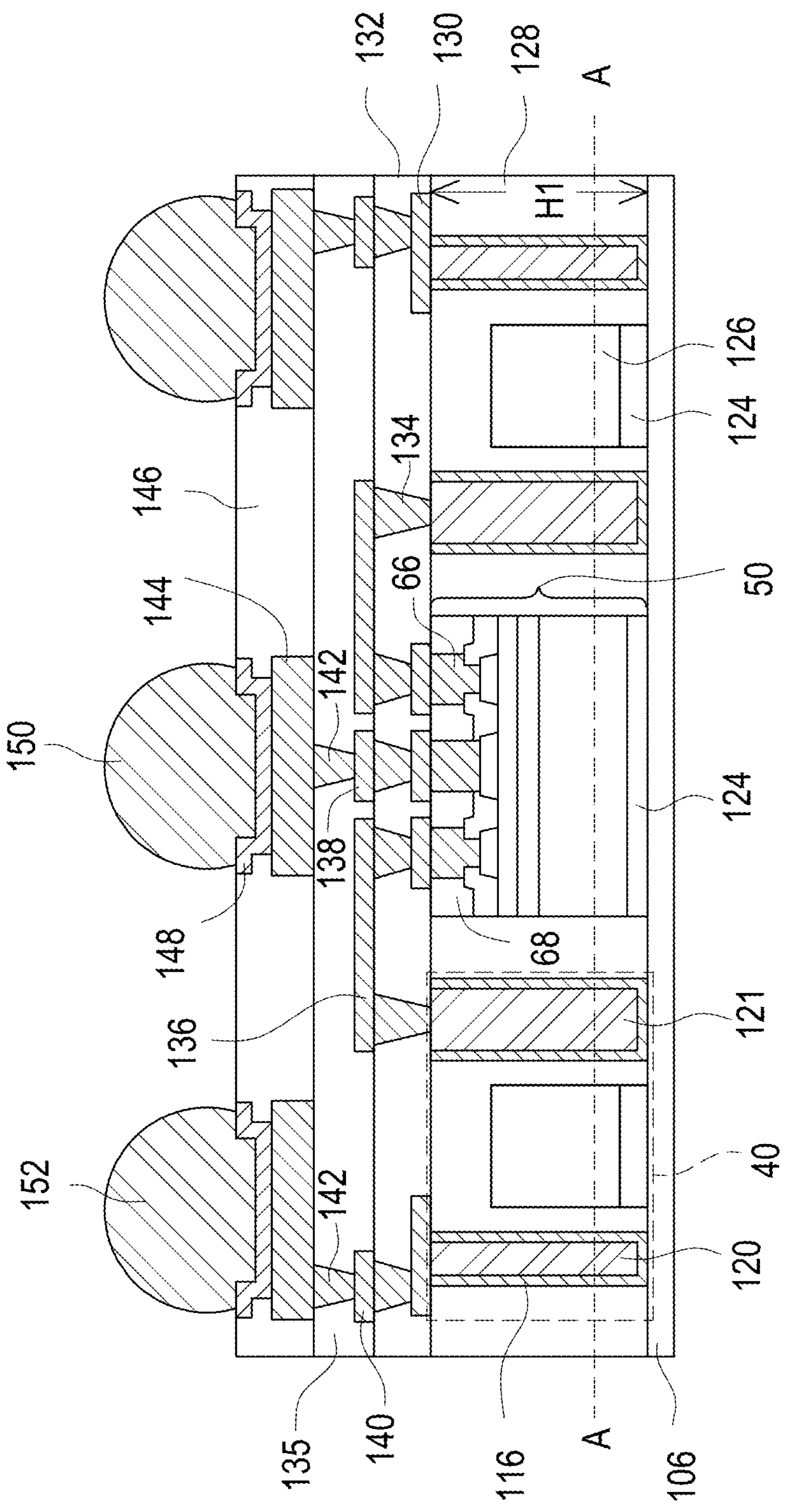

In FIG. 14A, a carrier substrate de-bonding is performed to detach (or “de-bond”) the carrier substrate 102 from the dielectric layer 106. In accordance with some embodiments, the de-bonding includes projecting a light such as a laser light or an UV light on the release layer 104 so that the release layer 104 decomposes under the heat of the light and the carrier substrate 102 can be removed. The dielectric layer 106 provides protection at the bottom side of the first package component 100. After the carrier substrate 102 is de-bonded from the back-side redistribution structure 105, a singulation process is then performed by sawing along scribe line regions, e.g., between the first package region 100A and the second package region 100B. The sawing singulates the first package region 100A from the second package region 100B. The resulting, singulated device stack is from one of the first package region 100A or the second package region 100B.

Further referring to FIG. 14A, each TIV grating 120 and its adjacent respective TIV plate 121 may be referred to as an antenna 40. A patch antenna is a microstrip antenna comprising a flat rectangular sheet or “patch’ of metal, usually mounted over a larger sheet of metal called a ground plane. In the embodiment described herein, each of the TIV plates 121 function as a “patch antenna” and the adjacent respective TIV grating 120 functions as the corresponding ground plane for the TIV plate 121. The TIV plate 121 and its respective TIV grating 120 form the antenna 40. Molding material 128 and a high-k block 126 fills the space between each TIV plate 121 and its respective TIV grating 120, forming an antenna oscillation cavity structure between the TIV plate 121 and the respective TIV grating 120, such as between a first sidewall of the TIV grating 120 and a second sidewall of the respective TIV plate 121 that faces the first sidewall. The TIV gratings 120 are electrically grounded when the first package component 100 is installed into its intended application environment. For example, in some embodiments, each of the TIV gratings 120 is electrically connected to conductive connectors 152 using a ground line 140. The TIV gratings 120 may comprise a conductive mesh, or a set of electrically connected vertical posts or pillars (e.g., having a shape that is rectangular, square, circular, or the like, when seen in a top-down view) that are parallel to each other. The molding material 128 may separate adjacent ones of the TIV gratings 120. In an embodiment, the TIV gratings 120 may be formed as a solid metal planar structure or any other suitable structure. In an embodiment, the TIV plates 121 may comprise conductive plates. Each of the TIV plates 121 may be electrically connected to one of the plurality of integrated circuit dies 50 by a corresponding feed line 136. In other embodiments, each TIV grating 120 and its respective TIV plate 121 may be electrically coupled to each other.

Figure 14B:
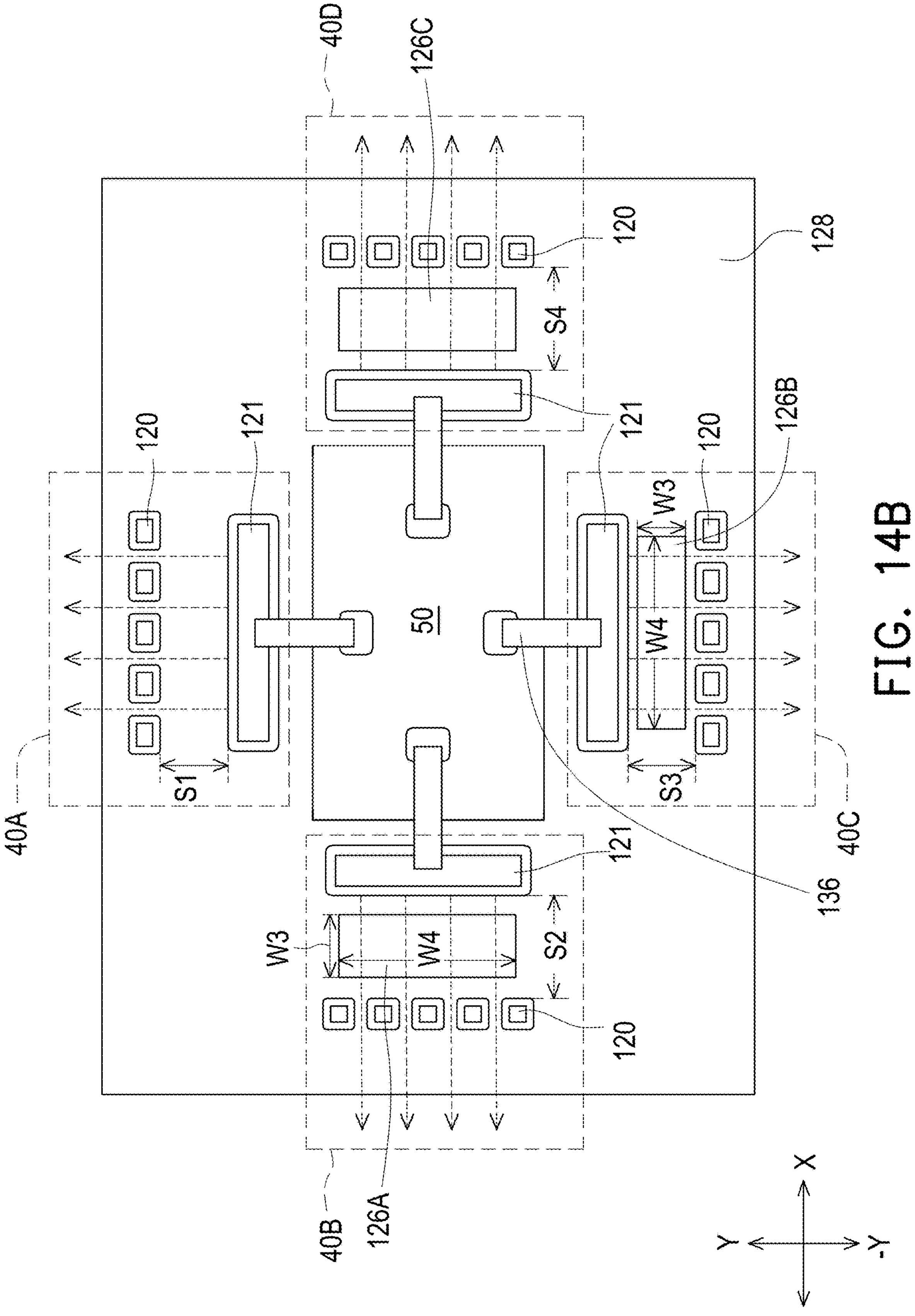

FIG. 14B illustrates a top-down view of a cross-section of the first package component 100 along a line A-A shown in FIG. 14A. The first package component 100 may comprise an integrated circuit die 50 having one antenna 40 adjacent to each sidewall of the integrated circuit die 50, such that the first package component 100 comprises four antennas 40. In other embodiments, the first package component 100 may have a greater or smaller number of antennas 40. The TIV plate 121 (e.g., the patch antenna) of each antenna 40 is electrically connected to the integrated circuit die 50 by an antenna feed line 136. An antenna oscillation cavity is formed between each TIV plate 121 and TIV grating 120 of an antenna 40. The TIV grating 120 functions as a ground plane for the antenna 40. Each antenna 40 of the first package component 100 comprises a vertical TIV plate 121 and respective vertical TIV grating 120 to form an antenna oscillation cavity in between the vertical TIV plate 121 and its respective vertical TIV grating 120. In this way, a major surface of the vertical TIV plate 121 (e.g., the conductive plate) is disposed in a plane that is perpendicular to a major surface of the carrier substrate 102. The major surface of the vertical TIV plate 121 (e.g., the conductive plate) is also disposed in a plane that is parallel to a sidewall of the integrated circuit die 50. In addition, a major surface of the TIV grating 120 (e.g., a major surface of each conductive pillar) is disposed in a plane that is perpendicular to a major surface of the carrier substrate 102. The major surface of the TIV grating 120 (e.g., a major surface of each conductive pillar) is also disposed in a plane that is parallel to the sidewall of the integrated circuit die 50. The antenna 40 is a directional antenna which allows it to transmit or receive power in specific directions. Because of the vertical orientations of the TIV plate 121 and TIV grating 120 of each antenna 40, each antenna 40 is able to transmit or receive 5G & 6G high-frequency radiation in a lateral direction that is parallel to a major surface of the carrier substrate 102.

In an embodiment, the first package component 100 may comprise a first antenna 40A adjacent to a first sidewall of the integrated circuit die 50, wherein a spacing S1 between a sidewall of a TIV grating 120 and a sidewall of a respective TIV plate 121 that faces the sidewall of the TIV grating 120 may be in a range from 0.1 μm to 10,000 μm. The first antenna 40A also comprises molding material 128 disposed between the sidewall of the TIV grating 120 and the sidewall of the respective TIV plate 121, with no high-k block 126 being present between the sidewall of the TIV grating 120 and the sidewall of the respective TIV plate 121. In this way, an entirety of a space between the sidewall of the TIV grating 120 and the sidewall of the respective TIV plate 121 that faces the sidewall of the TIV grating 120 is filled with the molding material 128. As a result, the dielectric constant value of the insulating material of the antenna oscillation cavity structure between the TIV grating 120 and the respective TIV plate 121 is equal to the dielectric constant value of the molding material 128, the dielectric constant value of the molding material 128 being in a range from 2.0 to 200. The first antenna 40A having the spacing S1 in the range from 1 μm to 10,000 μm between the sidewall of the TIV grating 120 and the sidewall of the respective TIV plate 121 that faces the sidewall of the TIV grating 120, and having the molding material 128 with a dielectric constant value in the range from 2.0 to 200 between the sidewall of the TIV grating 120 and the sidewall of the respective TIV plate 121 will allow the first antenna 40A to transmit and receive a RF band in a range from 700 MHz to 800 Mhz.

The first package component 100 may comprise a second antenna 40B adjacent to a second sidewall of the integrated circuit die 50, wherein a spacing S2 between a sidewall of a TIV grating 120 and a sidewall of a respective TIV plate 121 that faces the sidewall of the TIV grating 120 may be in a range from 0.1 μm to 500 μm. The second antenna 40B also comprises molding material 128 and a high-k block 126A disposed between the sidewall of the TIV grating 120 and the sidewall of the respective TIV plate 121, wherein a dielectric constant value of a material of the high-k block 126A is in a range from 3.9 to 20,000. As a result, the dielectric constant value of the combined insulating material (e.g. of the molding material 128 and the high-k block 126A) of the antenna oscillation cavity structure between the TIV grating 120 and the respective TIV plate 121 is equal to a weighted average dielectric constant value of the molding material 128 and the high-k block 126A. The second antenna 40B having the spacing S2 in the range from 1 μm to 10,000 μm between the sidewall of the TIV grating 120 and the sidewall of the respective TIV plate 121 that faces the sidewall of the TIV grating 120, and having the high-k block 126A with a dielectric constant value in the range from 3.9 to 20,000 between the sidewall of the TIV grating 120 and the sidewall of the respective TIV plate 121 will allow the second antenna 40B to transmit and receive a RF band in a range from 7 GHz to 8 GHz.

The first package component 100 may comprise a third antenna 40C adjacent to a third sidewall of the integrated circuit die 50, wherein a spacing S3 between a sidewall of a TIV grating 120 and a sidewall of a respective TIV plate 121 that faces the sidewall of the TIV grating 120 may be in a range from 0.1 μm to 10,000 μm. The third antenna 40C also comprises molding material 128 and a high-k block 126B disposed between the sidewall of the TIV grating 120 and the sidewall of the respective TIV plate 121, wherein a dielectric constant value of a material of the high-k block 126B is in a range from 3.9 to 30,000. As a result, the dielectric constant value of the combined insulating material (e.g. of the molding material 128 and the high-k block 126B) of the antenna oscillation cavity structure between the TIV grating 120 and the respective TIV plate 121 is equal to a weighted average dielectric constant value of the molding material 128 and the high-k block 126B. The third antenna 40C having the spacing S3 in the range from 1.0 μm to 100,000 μm between the sidewall of the TIV grating 120 and the sidewall of the respective TIV plate 121 that faces the sidewall of the TIV grating 120, and having the high-k block 126B with a dielectric constant value in the range from 3.9 to 40,000 between the sidewall of the TIV grating 120 and the sidewall of the respective TIV plate 121 will allow the third antenna 40C to transmit and receive a RF band in a range from 14 GHz to 16 GHz.

The first package component 100 may comprise a fourth antenna 40D adjacent to a fourth sidewall of the integrated circuit die 50, wherein a spacing S4 between a sidewall of a TIV grating 120 and a sidewall of a respective TIV plate 121 that faces the sidewall of the TIV grating 120 may be in a range from 0.1 μm to 10.00 μm. The fourth antenna 40D also comprises molding material 128 and a high-k block 126C disposed between the sidewall of the TIV grating 120 and the sidewall of the respective TIV plate 121, wherein a dielectric constant value of a material of the high-k block 126C is in a range from 3.9 to 50,000. As a result, the dielectric constant value of the combined insulating material (e.g. of the molding material 128 and the high-k block 126C) of the antenna oscillation cavity structure between the TIV grating 120 and the respective TIV plate 121 is equal to a weighted average dielectric constant value of the molding material 128 and the high-k block 126C. The fourth antenna 40D having the spacing S4 in the range from 1.0 μm to 100,000 μm between the sidewall of the TIV grating 120 and the sidewall of the respective TIV plate 121 that faces the sidewall of the TIV grating 120, and having the high-k block 126C with a dielectric constant value in the range from 3.9 to 60,000 between the sidewall of the TIV grating 120 and the sidewall of the respective TIV plate 121 will allow the fourth antenna 40D to transmit and receive a RF band in a range from 28 GHz to 32 GHz. In an embodiment, each of the high-k block 126A, the high-k block 126B, and the high-k block 126C may comprise the width W3 in a direction that is parallel to a direction moving from the TIV grating 120 to the TIV plate 121 of the respective second antenna 40B, third antenna 40C, or fourth antenna 40D. In addition, each of the high-k block 126A, the high-k block 126B, and the high-k block 126C may comprise the width W4 in a direction that is perpendicular to a direction moving from the TIV grating 120 to the TIV plate 121 of the respective second antenna 40B, third antenna 40C, or fourth antenna 40D. In an embodiment, the width W4 is in a range from 100 μm to 500,000 μm. Although four antennas 40 have been illustrated in FIG. 14B, fewer or more antennas 40 can be incorporated in the first package component 100. In addition, a larger number of antennas 40 can be incorporated in the first package component 100, wherein each antenna 40 is able to transmit and receive a different RF band with a different frequency range. This is done by using different high-k blocks 126 comprising different dielectric constant values that are disposed in the antenna oscillation cavity structure between a sidewall of the TIV grating 120 and a sidewall of the respective TIV plate 121 of each antenna 40, as well as varying a spacing between the sidewall of the TIV grating 120 and the sidewall of the respective TIV plate 121 of each antenna 40. For example, the first package component 100 may comprise at least 8 antennas 40, wherein each antenna 40 is able to transmit and receive a different RF band with a different frequency range. In another example, the first package component 100 may comprise more than 20 antennas 40, wherein each antenna 40 is able to transmit and receive a different RF band with a different frequency range.

Advantages can be achieved as a result of the formation of the first package component 100 comprising the TIV plates 121 and TIV gratings 120. One of the high-k blocks 126A-C is embedded in the molding material 128 between each TIV plate 121 and a respective TIV grating 120 to form an antenna oscillation cavity of each of the second antenna 40B, third antenna 40C, and fourth antenna 40D. Each of the high-k blocks 126A-C is comprised of a material that is different from materials of the other high-k blocks, and the different materials of the high-k blocks 126A-C have dielectric constants that are equal to or greater than 3.9. The dielectric constant of a material of each high-k block 126A-C is different from dielectric constants of materials of the other high-k blocks 126A-C. In addition, the spacing S1, the spacing S2, the spacing S3, and the spacing S4 may be varied between the TIV plate 121 and the respective TIV grating 120 of the first antenna 40A, the second antenna 40B, the third antenna 40C, and the fourth antenna 40D, respectively. These advantages may include allow for high-frequency lateral Radio Frequency (RF) transmission suitable for 5G & 6G high-frequency (e.g., 28, 38, 77, and 120 GHZ) RF transceivers, as well as portable, wearable, IoT (internet of things) and smart phone products. In addition, forming antenna oscillation cavities comprising the various high-k blocks 126A-C, wherein each of the high-k blocks 126A-C comprises a material having a different dielectric constant from materials of the other high-k blocks 126A-C allows for the transmission and receiving of up to four different RF bands with different frequency ranges. The high-k blocks 126A-C being disposed between each TIV plate 121 and its respective TIV grating 120 allows for a reduced size of each antenna oscillation cavity, resulting in a reduction in the size of the first package component 100 and making it more compact. Further, because the formation process of the TIV plates 121 and the TIV gratings 120 is compatible with current processes, manufacturing costs are reduced and efficiency is increased.

Figure 15:
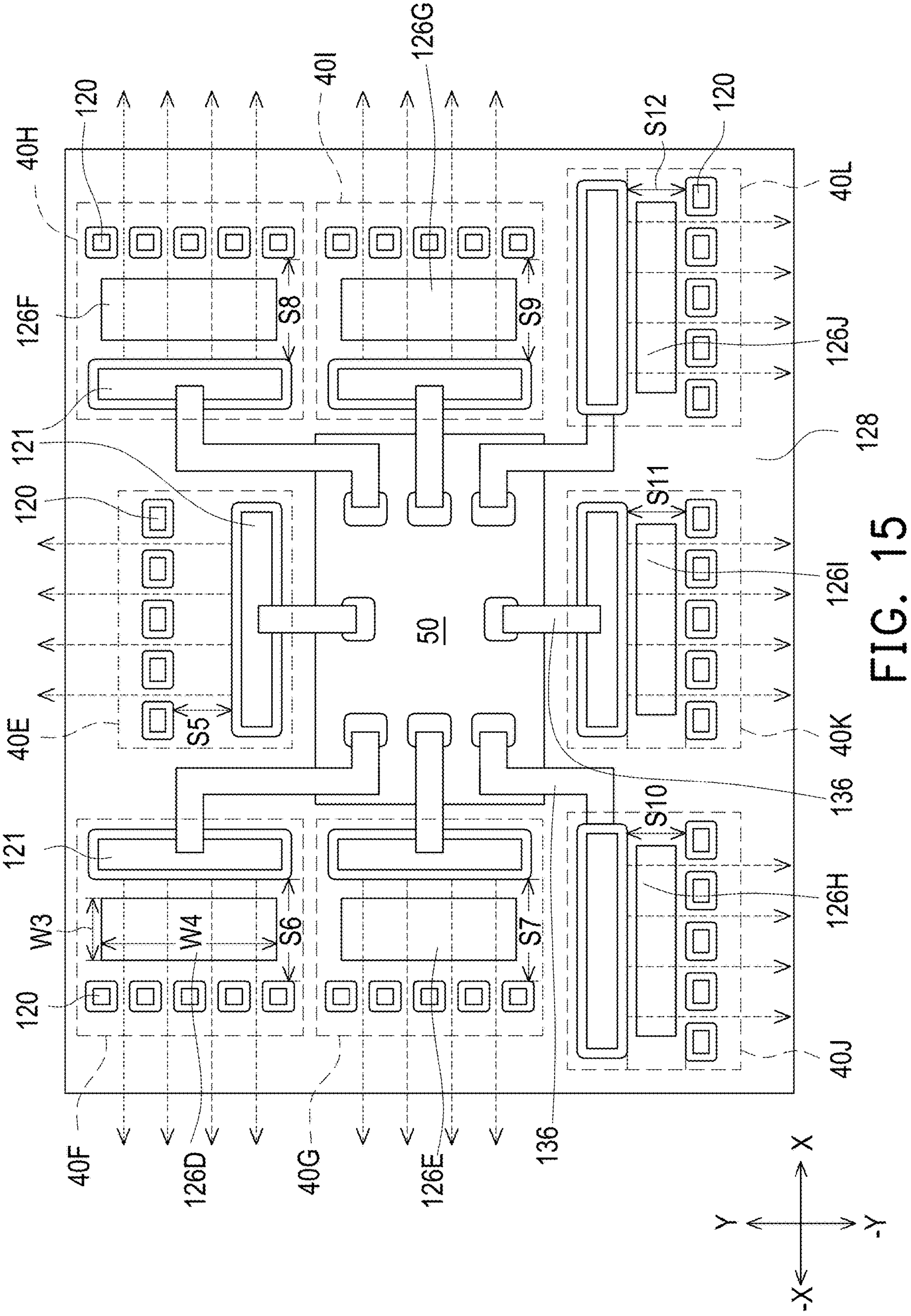
FIG. 15 illustrates a top-down view of the package component in accordance with other embodiments.

FIG. 15 illustrates the first package component 100 in accordance with some other embodiments. FIG. 15 illustrates a top-down view of a cross-section of the first package component 100 along the line A-A shown in FIG. 14A. Unless specified otherwise, like reference numerals in this embodiment (and subsequently discussed embodiments) represent like components in the embodiment shown in FIGS. 1 through 14B formed by like processes. Accordingly, the process steps and applicable materials may not be repeated herein. The first package component 100 may comprise an integrated circuit die 50 having eight antennas 40 adjacent to sidewalls of the integrated circuit die 50. The eight antennas 40 are disposed around a perimeter of the integrated circuit die 50. In other embodiments, the first package component 100 may have a greater or smaller number of antennas 40. The TIV plate 121 (e.g., the patch antenna) of each antenna 40 is electrically connected to the integrated circuit die 50 by an antenna feed line 136. An antenna oscillation cavity is formed between each TIV plate 121 and TIV grating 120 of an antenna 40. In an embodiment, the eight antennas 40 comprise a first antenna 40E, a second antenna 40F, a third antenna 40G, a fourth antenna 40H, a fifth antenna 40I, a sixth antenna 40J, a seventh antenna 40K, and an eighth antenna 40L. In an embodiment, the fourth antenna 40H and the fifth antenna 40I may be disposed such that a direction moving from the TIV plate 121 to the TIV grating 120 of each of the fourth antenna 40H and the fifth antenna 40I is parallel to a first direction (e.g., the x-direction). The first antenna 40E may be disposed such that a direction moving from the TIV plate 121 to the TIV grating 120 of the first antenna 40E is parallel to a second direction (e.g., the y-direction). The second antenna 40F and the third antenna 40G may be disposed such that a direction moving from the TIV plate 121 to the TIV grating 120 of each of the second antenna 40F and the third antenna 40G is parallel to a third direction (e.g., the negative x-direction). The sixth antenna 40J, the seventh antenna 40K, and the eighth antenna 40L may be disposed such that a direction moving from the TIV plate 121 to the TIV grating 120 of each of the sixth antenna 40J, the seventh antenna 40K, and the eighth antenna 40L is parallel to a fourth direction (e.g., the negative y-direction).

In an embodiment, the first antenna 40E may comprise a spacing S5 between a sidewall of a TIV grating 120 and a sidewall of a respective TIV plate 121 that faces the sidewall of the TIV grating 120, wherein the spacing S5 may be in a range from 0.1 μm to 100,000 μm. The first antenna 40E also comprises molding material 128 disposed between the sidewall of the TIV grating 120 and the sidewall of the respective TIV plate 121, with no high-k block 126 being present between the sidewall of the TIV grating 120 and the sidewall of the respective TIV plate 121. In this way, an entirety of a space between the sidewall of the TIV grating 120 and the sidewall of the respective TIV plate 121 that faces the sidewall of the TIV grating 120 is filled with the molding material 128. As a result, the dielectric constant value of the insulating material of the antenna oscillation cavity structure between the TIV grating 120 and the respective TIV plate 121 is equal to the dielectric constant value of the molding material 128, the dielectric constant value of the molding material 128 being in a range from 2.0 to 40,000. The first antenna 40E having the spacing S5 in the range from 0.1 μm to 100,000 μm between the sidewall of the TIV grating 120 and the sidewall of the respective TIV plate 121 that faces the sidewall of the TIV grating 120, and having the molding material 128 with a dielectric constant value in the range from 2.0 to 200 between the sidewall of the TIV grating 120 and the sidewall of the respective TIV plate 121 will allow the first antenna 40E to transmit and receive a RF band in a range from 700 MHz to 800 Mhz.

The second antenna 40F may comprise a spacing S6 between a sidewall of a TIV grating 120 and a sidewall of a respective TIV plate 121 that faces the sidewall of the TIV grating 120, wherein the spacing S6 may be in a range from 0.1 μm to 100,000 μm. The second antenna 40F also comprises molding material 128 and a high-k block 126D disposed between the sidewall of the TIV grating 120 and the sidewall of the respective TIV plate 121, wherein a dielectric constant value of a material of the high-k block 126D is in a range from 2.0 to 10,000. As a result, the dielectric constant value of the combined insulating material (e.g. of the molding material 128 and the high-k block 126D) of the antenna oscillation cavity structure between the TIV grating 120 and the respective TIV plate 121 is equal to a weighted average dielectric constant value of the molding material 128 and the high-k block 126D. The second antenna 40F having the spacing S6 in the range from 0.1 μm to 100,000 μm between the sidewall of the TIV grating 120 and the sidewall of the respective TIV plate 121 that faces the sidewall of the TIV grating 120, and having the high-k block 126D with a dielectric constant value in the range from 2.0 to 10,000 between the sidewall of the TIV grating 120 and the sidewall of the respective TIV plate 121 will allow the second antenna 40F to transmit and receive a RF band in a range from 7 GHz to 8 GHz.

The third antenna 40G may comprise a spacing S7 between a sidewall of a TIV grating 120 and a sidewall of a respective TIV plate 121 that faces the sidewall of the TIV grating 120, wherein the spacing S7 may be in a range from 0.1 μm to 200,000 μm. The third antenna 40G also comprises molding material 128 and a high-k block 126E disposed between the sidewall of the TIV grating 120 and the sidewall of the respective TIV plate 121, wherein a dielectric constant value of a material of the high-k block 126E is in a range from 2.0 to 20,000. As a result, the dielectric constant value of the combined insulating material (e.g. of the molding material 128 and the high-k block 126E) of the antenna oscillation cavity structure between the TIV grating 120 and the respective TIV plate 121 is equal to a weighted average dielectric constant value of the molding material 128 and the high-k block 126E. The third antenna 40G having the spacing S7 in the range from 0.1 μm to 200,000 μm between the sidewall of the TIV grating 120 and the sidewall of the respective TIV plate 121 that faces the sidewall of the TIV grating 120, and having the high-k block 126E with a dielectric constant value in the range from 2.0 to 20,000 between the sidewall of the TIV grating 120 and the sidewall of the respective TIV plate 121 will allow the third antenna 40G to transmit and receive a RF band in a range from 14 GHz to 16 GHz.

The fourth antenna 40H may comprise a spacing S8 between a sidewall of a TIV grating 120 and a sidewall of a respective TIV plate 121 that faces the sidewall of the TIV grating 120, wherein the spacing S8 may be in a range from 0.1 μm to 300,000 μm. The fourth antenna 40H also comprises molding material 128 and a high-k block 126F disposed between the sidewall of the TIV grating 120 and the sidewall of the respective TIV plate 121, wherein a dielectric constant value of a material of the high-k block 126F is in a range from 2.0 to 30,000. As a result, the dielectric constant value of the combined insulating material (e.g. of the molding material 128 and the high-k block 126F) of the antenna oscillation cavity structure between the TIV grating 120 and the respective TIV plate 121 is equal to a weighted average dielectric constant value of the molding material 128 and the high-k block 126F. The fourth antenna 40H having the spacing S8 in the range from 0.1 μm to 400,000 μm between the sidewall of the TIV grating 120 and the sidewall of the respective TIV plate 121 that faces the sidewall of the TIV grating 120, and having the high-k block 126F with a dielectric constant value in the range from 2.0 to 30,000 between the sidewall of the TIV grating 120 and the sidewall of the respective TIV plate 121 will allow the fourth antenna 40H to transmit and receive a RF band in a range from 28 GHz to 32 GHz.

The fifth antenna 40I may comprise a spacing S9 between a sidewall of a TIV grating 120 and a sidewall of a respective TIV plate 121 that faces the sidewall of the TIV grating 120, wherein the spacing S9 may be in a range from 0.1 μm to 500,000 μm. The fifth antenna 40I also comprises molding material 128 and a high-k block 126G disposed between the sidewall of the TIV grating 120 and the sidewall of the respective TIV plate 121, wherein a dielectric constant value of a material of the high-k block 126G is in a range from 2.0 to 40,000. As a result, the dielectric constant value of the combined insulating material (e.g. of the molding material 128 and the high-k block 126G) of the antenna oscillation cavity structure between the TIV grating 120 and the respective TIV plate 121 is equal to a weighted average dielectric constant value of the molding material 128 and the high-k block 126G. The fifth antenna 40I having the spacing S9 in the range from 0.1 μm to 600,000 μm between the sidewall of the TIV grating 120 and the side wall of the respective TIV plate 121 that faces the sidewall of the TIV grating 120, and having the high-k block 126G with a dielectric constant value in the range from 2.0 to 40,000 between the sidewall of the TIV grating 120 and the sidewall of the respective TIV plate 121 will allow the fifth antenna 40I to transmit and receive a RF band in a range from 56 GHz to 64 GHz.

The sixth antenna 40J may comprise a spacing S10 between a sidewall of a TIV grating 120 and a sidewall of a respective TIV plate 121 that faces the sidewall of the TIV grating 120, wherein the spacing S10 may be in a range from 0.1 μm to 700,000 μm. The sixth antenna 40J also comprises molding material 128 and a high-k block 126H disposed between the sidewall of the TIV grating 120 and the sidewall of the respective TIV plate 121, wherein a dielectric constant value of a material of the high-k block 126H is in a range from 2.0 to 50.000. As a result, the dielectric constant value of the combined insulating material (e.g. of the molding material 128 and the high-k block 126H) of the antenna oscillation cavity structure between the TIV grating 120 and the respective TIV plate 121 is equal to a weighted average dielectric constant value of the molding material 128 and the high-k block 126H. The sixth antenna 40J having the spacing S10 in the range from 0.1 μm to 700.000 μm between the sidewall of the TIV grating 120 and the sidewall of the respective TIV plate 121 that faces the sidewall of the TIV grating 120, and having the high-k block 126H with a dielectric constant value in the range from 2.0 to 60,000 between the sidewall of the TIV grating 120 and the sidewall of the respective TIV plate 121 will allow the sixth antenna 40J to transmit and receive a RF band in a range from 112 GHz to 128 GHz.

The seventh antenna 40K may comprise a spacing S11 between a sidewall of a TIV grating 120 and a sidewall of a respective TIV plate 121 that faces the sidewall of the TIV grating 120, wherein the spacing S11 may be in a range from 0.1 μm to 800,000 μm. The seventh antenna 40K also comprises molding material 128 and a high-k block 126I disposed between the sidewall of the TIV grating 120 and the sidewall of the respective TIV plate 121, wherein a dielectric constant value of a material of the high-k block 126I is in a range from 2.0 to 70,000. As a result, the dielectric constant value of the combined insulating material (e.g. of the molding material 128 and the high-k block 126I) of the antenna oscillation cavity structure between the TIV grating 120 and the respective TIV plate 121 is equal to a weighted average dielectric constant value of the molding material 128 and the high-k block 126I. The seventh antenna 40K having the spacing S11 in the range from 0.1 μm to 900,000 μm between the sidewall of the TIV grating 120 and the sidewall of the respective TIV plate 121 that faces the sidewall of the TIV grating 120, and having the high-k block 126I with a dielectric constant value in the range from 2.0 to 80,000 between the sidewall of the TIV grating 120 and the sidewall of the respective TIV plate 121 will allow the seventh antenna 40K to transmit and receive a RF band in a range from 224 GHz to 256 GHz.

The eighth antenna 40L may comprise a spacing S12 between a sidewall of a TIV grating 120 and a sidewall of a respective TIV plate 121 that faces the sidewall of the TIV grating 120, wherein the spacing S12 may be in a range from 0.1 μm to 1000,000 μm. The eighth antenna 40L also comprises molding material 128 and a high-k block 126J disposed between the sidewall of the TIV grating 120 and the sidewall of the respective TIV plate 121, wherein a dielectric constant value of a material of the high-k block 126J is in a range from 2.0 to 90,000. As a result, the dielectric constant value of the combined insulating material (e.g. of the molding material 128 and the high-k block 126J)

of the antenna oscillation cavity structure between the TIV grating 120 and the respective TIV plate 121 is equal to a weighted average dielectric constant value of the molding material 128 and the high-k block 126J. The eighth antenna 40L having the spacing S12 in the range from 0.1 μm to 1100,000 μm between the sidewall of the TIV grating 120 and the sidewall of the respective TIV plate 121 that faces the sidewall of the TIV grating 120, and having the high-k block 126J with a dielectric constant value in the range from 2.0 to 100,000 between the sidewall of the TIV grating 120 and the sidewall of the respective TIV plate 121 will allow the eighth antenna 40L to transmit and receive a RF band in a range from 448 GHz to 512 GHz. Although eight antennas 40 have been illustrated in FIG. 15, fewer or more antennas 40 can be incorporated in the first package component 100. In addition, a larger number of antennas 40 can be incorporated in the first package component 100, wherein each antenna 40 is able to transmit and receive a different RF band with a different frequency range. This is done by using different high-k blocks 126 comprising different dielectric constant values that are disposed in the antenna oscillation cavity structure between a sidewall of the TIV grating 120 and a sidewall of the respective TIV plate 121 of each antenna 40, as well as varying a spacing between the sidewall of the TIV grating 120 and the sidewall of the respective TIV plate 121 of each antenna 40. In an embodiment, each of the high-k block 126D, the high-k block 126E, the high-k block 126F, the high-k block 126G, the high-k block 126H, the high-k block 126I, and the high-k block 126J may comprise the width W3 in a direction that is parallel to a direction moving from the TIV grating 120 to the TIV plate 121 of the respective second antenna 40F, third antenna 40G, fourth antenna 40H, fifth antenna 40I, sixth antenna 40J, seventh antenna 40K or eighth antenna 40L. In addition, each of high-k block 126D, the high-k block 126E, the high-k block 126F, the high-k block 126G, the high-k block 126H, the high-k block 126I, and the high-k block 126J may comprise the width W4 in a direction that is perpendicular to a direction moving from the TIV grating 120 to the TIV plate 121 of the respective second antenna 40F, third antenna 40G, fourth antenna 40H, fifth antenna 40I, sixth antenna 40J, seventh antenna 40K or eighth antenna 40L.

Advantages can be achieved as a result of the formation of the first package component 100 comprising the TIV plates 121 and TIV gratings 120. One of the high-k blocks 126D-J is embedded in the molding material 128 between each TIV plate 121 and a respective TIV grating 120 to form an antenna oscillation cavity of each of the second antenna 40F, third antenna 40G, fourth antenna 40H, fifth antenna 40I, sixth antenna 40J, seventh antenna 40K and eighth antenna 40L. Each of the high-k blocks 126D-J is comprised of a material that is different from materials of the other high-k blocks 126D-J, and the different materials of the high-k blocks 126D-J have dielectric constants that are equal to or greater than 3.9. The dielectric constant of a material of each high-k block 126D-J is different from dielectric constants of materials of the other high-k blocks 126D-J. In addition, the spacings S5 through S12 may be varied between the TIV plate 121 and the respective TIV grating 120 of the first antenna 40E through the eighth antenna 40L, respectively. These advantages may include allow for high-frequency lateral Radio Frequency (RF) transmission suitable for 5G & 6G high-frequency (e.g., 28, 38, 77, and 120 GHz) RF transceivers, as well as portable, wearable, IoT (internet of things) and smart phone products. In addition, forming antenna oscillation cavities comprising the various high-k blocks 126D-J, wherein each of the high-k blocks 126D-J comprises a material having a different dielectric constant from materials of the other high-k blocks 126D-J allows for the transmission and receiving of up to eight different RF bands with different frequency ranges. The high-k blocks 126D-J being disposed between each TIV plate 121 and its respective TIV grating 120 allows for a reduced size of each antenna oscillation cavity, resulting in a reduction in the size of the first package component 100 and making it more compact. Further, because the formation process of the TIV plates 121 and the TIV gratings 120 is compatible with current processes, manufacturing costs are reduced and efficiency is increased.

Figure 16:
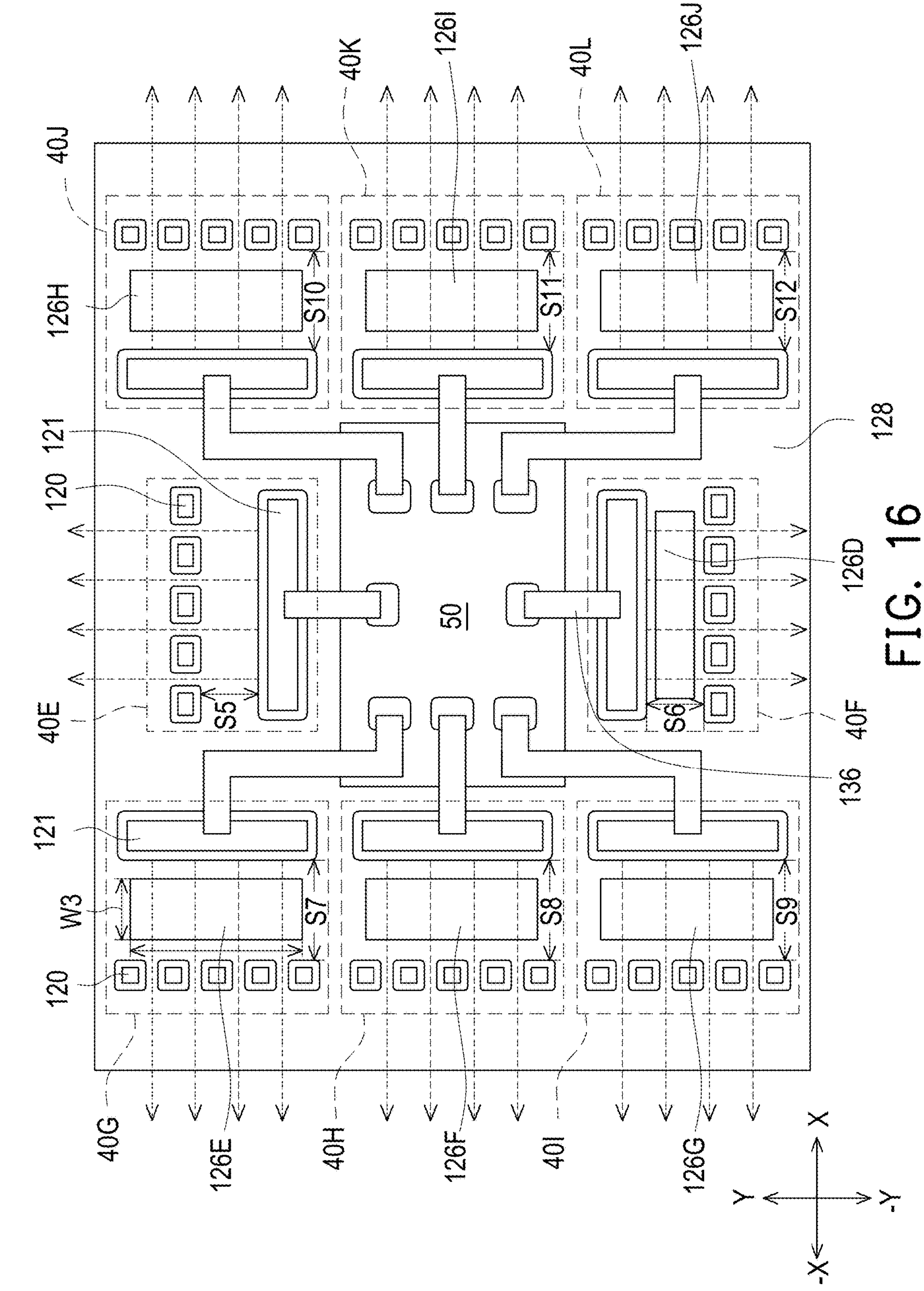
FIG. 16 illustrates a top-down view of the package component in accordance with other embodiments.

FIG. 16 illustrates the first package component 100 in accordance with some other embodiments. FIG. 16 illustrates a top-down view of a cross-section of the first package component 100 along the line A-A shown in FIG. 14A. Unless specified otherwise, like reference numerals in this embodiment (and subsequently discussed embodiments) represent like components in the embodiment shown in FIGS. 1 through 15 formed by like processes. Accordingly, the process steps and applicable materials may not be repeated herein. The first package component 100 may comprise an integrated circuit die 50 having eight antennas 40 adjacent to sidewalls of the integrated circuit die 50. The eight antennas 40 are disposed around a perimeter of the integrated circuit die 50. In other embodiments, the first package component 100 may have a greater or smaller number of antennas 40. In an embodiment, the eight antennas 40 comprise the first antenna 40E, the second antenna 40F, the third antenna 40G, the fourth antenna 40H, the fifth antenna 40I, the sixth antenna 40J, the seventh antenna 40K, and the eighth antenna 40L that were described earlier in FIG. 15. In an embodiment, the sixth antenna 40J, the seventh antenna 40K and the eighth antenna 40L may be disposed such that a direction moving from the TIV plate 121 to the TIV grating 120 of each of the sixth antenna 40J, the seventh antenna 40K and the eighth antenna 40L is parallel to a first direction (e.g., the x-direction). The first antenna 40E may be disposed such that a direction moving from the TIV plate 121 to the TIV grating 120 of the first antenna 40E is parallel to a second direction (e.g., the y-direction). The third antenna 40G, the fourth antenna 40H, and the fifth antenna 40I may be disposed such that a direction moving from the TIV plate 121 to the TIV grating 120 of each of the third antenna 40G, the fourth antenna 40H, and the fifth antenna 40I is parallel to a third direction (e.g., the negative x-direction). The second antenna 40F may be disposed such that a direction moving from the TIV plate 121 to the TIV grating 120 of the second antenna 40F is parallel to a fourth direction (e.g., the negative y-direction). Although eight antennas 40 have been illustrated in FIG. 16, fewer or more antennas 40 can be incorporated in the first package component 100. In addition, a larger number of antennas 40 can be incorporated in the first package component 100, wherein each antenna 40 is able to transmit and receive a different RF band with a different frequency range. This is done by using different high-k blocks 126 comprising different dielectric constant values that are disposed in the antenna oscillation cavity structure between a sidewall of the TIV grating 120 and a sidewall of the respective TIV plate 121 of each antenna 40, as well as varying a spacing between the sidewall of the TIV grating 120 and the sidewall of the respective TIV plate 121 of each antenna 40.

Figure 17:
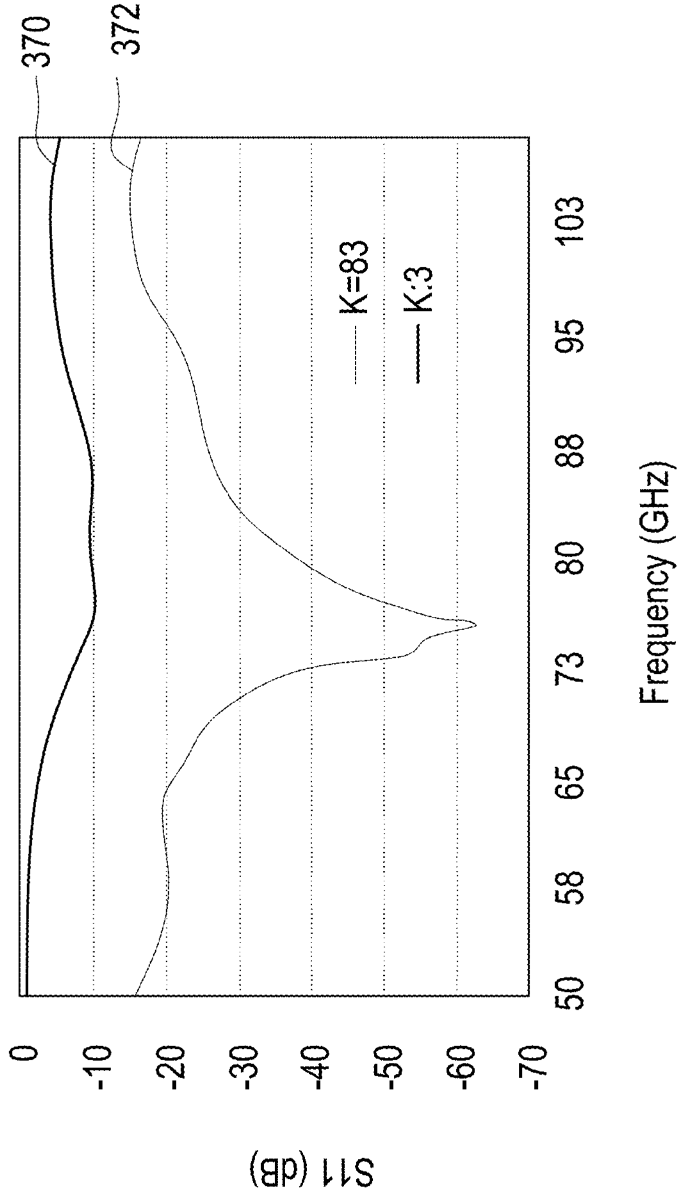
FIG. 17 illustrates a schematic diagram of a simulation result for different insulating materials, in accordance with some embodiments.

In FIG. 17, a schematic diagram of a simulation result for different insulating materials is shown, in accordance with some embodiments. The antenna configuration for the simulation is similar to the structure shown in FIG. 14A with the resonance frequency set at about 77 GHZ. Two different insulating film materials are simulated and the performances of their S-parameters S11 (generic representation of a signal return loss) are compared. Referring to FIG. 17, a line 370 and a line 372 represent the simulation results for the materials with dielectric constants of around 3.0 and 83, respectively. As shown in FIG. 17, the first material with a dielectric constant of 3.0 exhibits a return loss in a range from −10 dB to 0 dB with a local minimum at around 75-88 GHz. In contrast, the second dielectric material with a dielectric constant of 83 exhibits a signal loss in a range from −62 dB to −23 dB. Specifically, the second dielectric material provides a sharper frequency selectivity gain at a valley around 76 GHz.

In accordance with an embodiment, a package structure includes a first die; an insulating material around the first die; a first antenna extending through the insulating material, where the first antenna includes a first conductive plate extending through the insulating material; and a plurality of first conductive pillars extending through the insulating material, where the first conductive plate is disposed between the plurality of first conductive pillars and the first die; and a first high-k block embedded in the insulating material, where the first high-k block is disposed between the first conductive plate and the plurality of first conductive pillars, and where the first high-k block includes a material having a dielectric constant that is different than a dielectric constant of the insulating material. In an embodiment, the dielectric constant of the material of the first high-k block is higher than the dielectric constant of the insulating material. In an embodiment, the insulating material separates adjacent ones of the plurality of first conductive pillars. In an embodiment, a major surface of the first conductive plate and a major surface of each first conductive pillar of the plurality of first conductive pillars is disposed in a plane that is parallel to a first sidewall of the first die. In an embodiment, the package structure further includes a second antenna extending through the insulating material, where the second antenna includes a second conductive plate extending through the insulating material; a plurality of second conductive pillars extending through the insulating material, where the second conductive plate is disposed between the plurality of second conductive pillars and the first die; and a second high-k block embedded in the insulating material, where the second high-k block is disposed between the second conductive plate and the plurality of second conductive pillars. In an embodiment, the first antenna is adjacent to a first sidewall of the first die, and the second antenna is adjacent to a second sidewall of the first die. In an embodiment, the dielectric constant of the material of the first high-k block is higher than the dielectric constant of the insulating material, and where a dielectric constant of a material of the second high-k block is higher than the dielectric constant of the material of the first high-k block. In an embodiment, the first high-k block and the second high-k block include $SiO_2$, $Si_3N_4$, $Al_2O_3$, $Y_2O_3$, $TiO_2$, $HfO_2$, $ZrO_2$, $PbZrTiO_3$, $BaTiO_3$, $BaSrTiO_3$, or $SrTiO_3$.

In accordance with an embodiment, a package includes a first polymer layer; an insulating material over the first polymer layer; a die embedded in the insulating material; a first antenna including a first portion extending through the insulating material to a first feed line that electrically connects the die and the first portion of the first antenna; and a second portion extending through the insulating material, the second portion of the first antenna including a plurality of conductive pillars, where the first antenna has a first spacing between a first sidewall of the first portion and a second sidewall of the second portion that faces the first sidewall of the first portion; and a second antenna including a third portion extending through the insulating material to a second feed line that electrically connects the die and the third portion of the second antenna; and a fourth portion extending through the insulating material, the fourth portion of the second antenna including a plurality of conductive pillars, where the second antenna has a second spacing between a third sidewall of the third portion and a fourth sidewall of the fourth portion that faces the third sidewall of the first portion, where the first spacing is different from the second spacing. In an embodiment, the package further includes a first redistribution structure over the die and the insulating material; a first conductive connector electrically connected to the die through the first redistribution structure; and second conductive connectors electrically connected to the second portion of the first antenna and the fourth portion of the second antenna through the first redistribution structure. In an embodiment, the package further includes a first cuboid disposed between the first portion of the first antenna and the second portion of the first antenna; and a second cuboid disposed between the third portion of the second antenna and the fourth portion of the second antenna. In an embodiment, the first cuboid includes a first material with a first dielectric constant, where the second cuboid includes a second material with a second dielectric constant, and where the first dielectric constant and the second dielectric constant are different. In an embodiment, the first cuboid and the second cuboid include $SiO_2$, $Si_3N_4$, $Al_2O_3$, $Y_2O_3$, $TiO_2$, $HfO_2$, $ZrO_2$, $PbZrTiO_3$, $BaTiO_3$, $BaSrTiO_3$, or $SrTiO_3$. In an embodiment, the package further includes a third antenna including a fifth portion extending through the insulating material to a third feed line that electrically connects the die and the fifth portion of the third antenna; and a sixth portion extending through the insulating material, the sixth portion of the third antenna including a plurality of conductive pillars, where the third antenna has a third spacing between a fifth sidewall of the fifth portion and a sixth sidewall of the sixth portion that faces the fifth sidewall of the fifth portion, where the third spacing is different from the second spacing and the first spacing. In an embodiment, an entirety of a space between the fifth portion and the sixth portion of the third antenna is filled with the insulating material.

In accordance with an embodiment, a method of forming a package includes forming a first polymer layer over a substrate; forming a plurality of first conductive pillars and a first conductive plate on the first polymer layer; attaching a die to the first polymer layer, where the first conductive plate is disposed between the plurality of first conductive pillars and the die; attaching a high-k block to the first polymer layer, where the high-k block is disposed between the plurality of first conductive pillars and the first conductive plate; forming a molding material over the first polymer layer, where the molding material surrounds the die, the high-k block, the plurality of first conductive pillars and the first conductive plate, where a dielectric constant of a material of the high-k block is different from a dielectric constant of the molding material. In an embodiment, the method further includes forming a first redistribution structure over the die, the high-k block, the molding material, the plurality of first conductive pillars and the first conductive plate, where a first feed line in the first redistribution structure electrically connects the die to the first conductive plate. In an embodiment, the dielectric constant of the material of the high-k block is higher than the dielectric constant of the molding material. In an embodiment, the dielectric constant of the material of the high-k block is equal to or greater than 3.9. In an embodiment, attaching the die to the first polymer layer and attaching the high-k block to the first polymer layer is performed at the same time.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure comprising:
a first die;
an insulating material around the first die;
a first antenna extending through the insulating material and disposed adjacent to a first sidewall of the first die, wherein the first antenna comprises:
a first conductive plate extending through the insulating material; and
a plurality of first conductive pillars extending through the insulating material;
a second antenna extending through the insulating material and disposed adjacent to a second sidewall of the first die, wherein the second antenna comprises:
a second conductive plate extending through the insulating material; and
a plurality of second conductive pillars extending through the insulating material;
a first high-k block embedded in the insulating material and disposed between the first conductive plate and the plurality of first conductive pillars; and
a second high-k block embedded in the insulating material and disposed between the second conductive plate and the plurality of second conductive pillars.

2. The package structure of claim 1, wherein the first high-k block and the second high-k block comprise $SiO_2$, $Si_3N_4$, $Al_2O_3$, $Y_2O_3$, $TiO_2$, $HfO_2$, $ZrO_2$, $PbZrTiO_3$, $BaTiO_3$, $BaSrTiO_3$, or $SrTiO_3$.

3. The package structure of claim 1, wherein a dielectric constant of a material of the first high-k block and a dielectric constant of a material of the second high-k block are higher than a dielectric constant of the insulating material.

4. The package structure of claim 3, wherein the dielectric constant of the material of the first high-k block is higher than the dielectric constant of the material of the second high-k block.

5. The package structure of claim 1, wherein the first sidewall of the first die and the second sidewall of the first die are parallel to each other.

6. The package structure of claim 5, further comprising:
a third antenna extending through the insulating material and disposed adjacent to a third sidewall of the first die, wherein the third antenna comprises:
a third conductive plate extending through the insulating material; and
a plurality of third conductive pillars extending through the insulating material; and
a third high-k block embedded in the insulating material and disposed between the third conductive plate and the plurality of third conductive pillars.

7. The package structure of claim 6, wherein a dielectric constant of a material of the third high-k block is higher than a dielectric constant of a material of the first high-k block.

8. The package structure of claim 6, wherein the third sidewall of the first die is perpendicular to the first sidewall of the first die and the second sidewall of the first die.

9. A package comprising:
an insulating material over a polymer layer;
a first die embedded in the insulating material;
a first antenna disposed adjacent a first sidewall of the first die, the first antenna comprising:
a first portion extending through the insulating material; and
a second portion extending through the insulating material, the second portion of the first antenna comprising a plurality of conductive pillars, wherein the first portion of the first antenna is disposed between the second portion of the first antenna and the first sidewall of the first die; and
a second antenna disposed adjacent a second sidewall of the first die, the second antenna comprising:
a third portion extending through the insulating material; and
a fourth portion extending through the insulating material, the fourth portion of the second antenna comprising a plurality of conductive pillars, wherein the third portion of the second antenna is disposed between the fourth portion of the second antenna and the second sidewall of the first die.

10. The package of claim 9, wherein the first sidewall of the first die and the second sidewall of the first die are parallel to each other.

11. The package of claim 9, wherein the first sidewall of the first die and the second sidewall of the first die are perpendicular to each other.

12. The package of claim 9, further comprising:
a first high-k block disposed between the first portion of the first antenna and the second portion of the first antenna; and
a second high-k block disposed between the third portion of the second antenna and the fourth portion of the second antenna.

13. The package of claim 12, wherein a material of the first high-k block, a material of the second high-k block, and a material of the insulating material are different from each other.

14. The package of claim 13, wherein the material of the first high-k block and the material of the second high-k block comprise $SiO_2$, $Si_3N_4$, $Al_2O_3$, $Y_2O_3$, $TiO_2$, $HfO_2$, $ZrO_2$, $PbZrTiO_3$, $BaTiO_3$, $BaSrTiO_3$, or $SrTiO_3$.

15. The package of claim 9, further comprising:
a first redistribution structure over the first die and the insulating material;
a first conductive connector electrically connected to the first die through the first redistribution structure; and
second conductive connectors electrically connected to the second portion of the first antenna and the fourth portion of the second antenna through the first redistribution structure.

16. A method of forming a package, the method comprising:
forming a first dielectric layer over a substrate;
forming a plurality of first conductive pillars and a first conductive plate on the first dielectric layer;

forming a plurality of second conductive pillars and a second conductive plate on the first dielectric layer;

attaching a die to the first dielectric layer, wherein the die is disposed between the first conductive plate and the second conductive plate;

attaching a first high-k block to the first dielectric layer, wherein the first high-k block is disposed between the plurality of first conductive pillars and the first conductive plate; and attaching a second high-k block to the first dielectric layer, wherein the second high-k block is disposed between the plurality of second conductive pillars and the second conductive plate, wherein a dielectric constant of a material of the first high-k block is different from a dielectric constant of a material of the second high-k block.

17. The method of claim 16, wherein the material of the first high-k block and the material of the second high-k block comprise $SiO_2$, $Si_3N_4$, $Al_2O_3$, $Y_2O_3$, $TiO_2$, $HfO_2$, $ZrO_2$, $PbZrTiO_3$, $BaTiO_3$, $BaSrTiO_3$, or $SrTiO_3$.

18. The method of claim 16, further comprising:

forming a molding material over the first dielectric layer, wherein the molding material surrounds the die, the first high-k block, the second high-k block, the plurality of first conductive pillars, the first conductive plate, the plurality of second conductive pillars, and the second conductive plate.

19. The method of claim 18, wherein the dielectric constant of the material of the first high-k block and the dielectric constant of the material of the second high-k block are different from a dielectric constant of the molding material.

20. The method of claim 18, further comprising:

forming a first redistribution structure over the die, the first high-k block, the second high-k block, the molding material, the plurality of first conductive pillars, the first conductive plate, the plurality of second conductive pillars, and the second conductive plate, wherein a first feed line in the first redistribution structure electrically connects the die to the first conductive plate, and wherein a second feed line in the first redistribution structure electrically connects the die to the second conductive plate.

* * * * *